(12) United States Patent
Kohashi et al.

(10) Patent No.: US 7,471,096 B2
(45) Date of Patent: Dec. 30, 2008

(54) CONTACTOR FOR ELECTRONIC PARTS AND A CONTACT METHOD

(75) Inventors: Naohito Kohashi, Kawasaki (JP);
Shigeyuki Maruyama, Kawasaki (JP);
Yoshikazu Arisaka, Kawasaki (JP);
Hiroyuki Murotani, Kawasaki (JP);
Katsuhiko Ono, Yokohama (JP)

(73) Assignee: Fujitsu Limited, Kawasaki (JP)

( * ) Notice: Subject to any disclaimer, the term of this patent is extended or adjusted under 35 U.S.C. 154(b) by 119 days.

(21) Appl. No.: 11/339,836

(22) Filed: Jan. 26, 2006

(65) Prior Publication Data
US 2006/0186905 A1 Aug. 24, 2006

(30) Foreign Application Priority Data
Feb. 22, 2005 (JP) ............................. 2005-046145
Oct. 7, 2005 (JP) ............................. 2005-295639

(51) Int. Cl.
*G01R 31/02* (2006.01)
(52) U.S. Cl. .................. 324/755; 324/754; 324/765
(58) Field of Classification Search ............ None
See application file for complete search history.

(56) References Cited

U.S. PATENT DOCUMENTS 6,069,481 A * 5/2000 Matsumura ............... 324/755
6,636,057 B1 * 10/2003 Uchikura ................. 324/754
6,932,619 B2 8/2005 Chen
7,049,838 B2 * 5/2006 Kagami .................... 324/754

FOREIGN PATENT DOCUMENTS

JP 11-97139 A 4/1999
JP 11-190758 7/1999
JP 2001-292048 10/2001

OTHER PUBLICATIONS

Korean Office Action dated Feb. 15, 2007, issued in corresponding Korean Application No. 10-2006-0017112.
Office Action issued in Taiwanese Appln. No. 095103092, issued May 15, 2008.
Taiwanese Appln. No. M253942, filed Dec. 21, 2004.

* cited by examiner

*Primary Examiner*—Minh N Tang
(74) *Attorney, Agent, or Firm*—Westerman, Hattori, Daniels & Adrian, LLP.

(57) ABSTRACT

A contactor for electronic parts can provide an appropriate and uniform contact with respect to a plurality of electrode terminals in an electronic part such as an IC. Each of a plurality of contact members has a first contact portion on one end thereof and a second contact portion on the other end thereof, the first contract portion having a recessed portion that receives one of the electrode terminals of the electronic part. A base accommodates and supports the plurality of the contact members. The first contact portion is movable in a horizontal direction.

10 Claims, 28 Drawing Sheets

FREE ⇔ HOLD
SET GUIDE PLATE

FIG.16
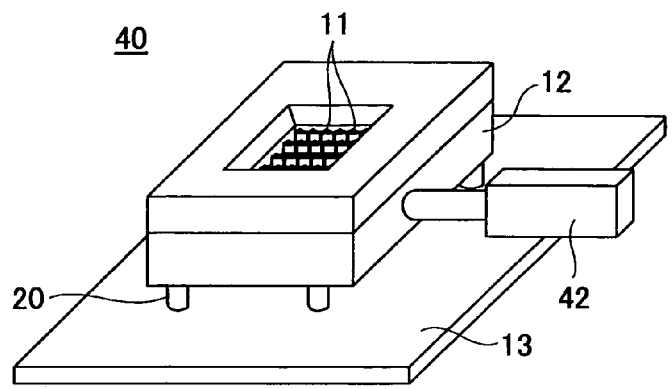
FIG.17A
FIG.17B
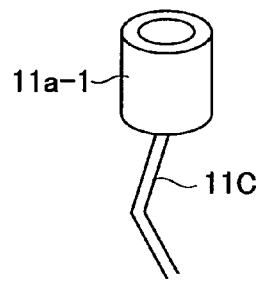
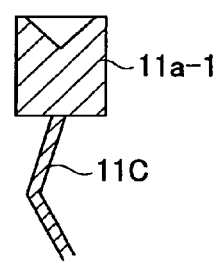
FIG.18A
FIG.18B
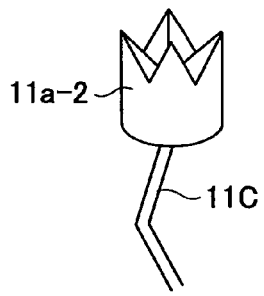
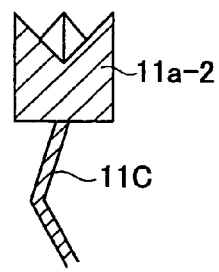
FIG.19A
FIG.19B
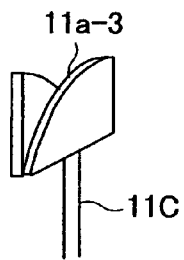
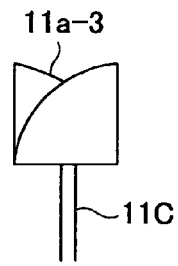

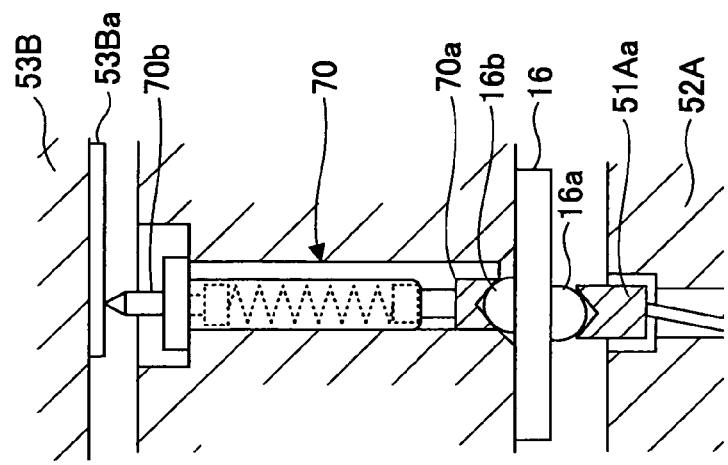
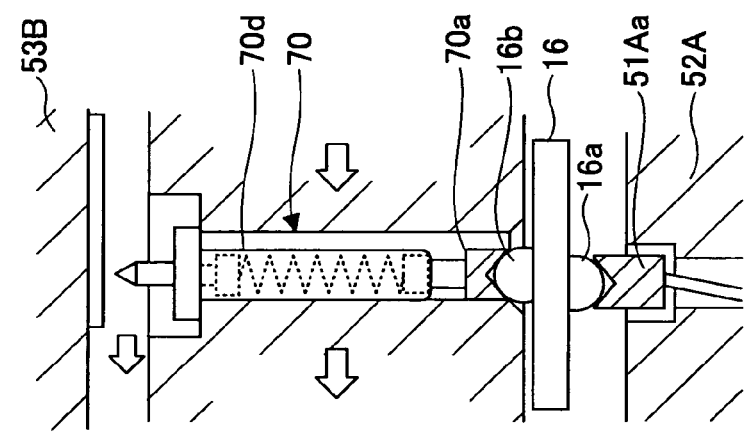
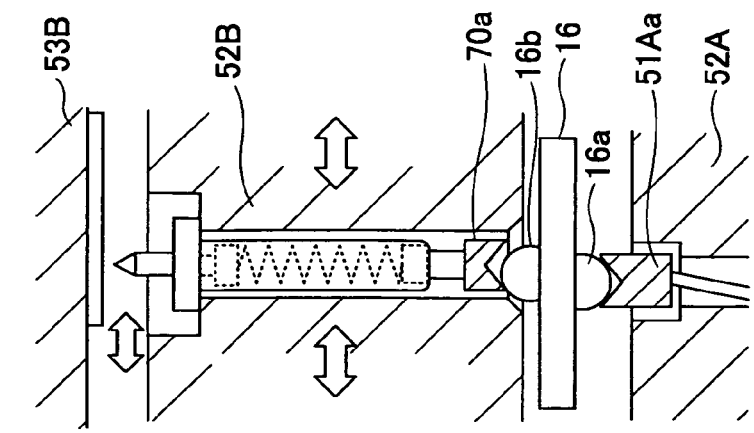

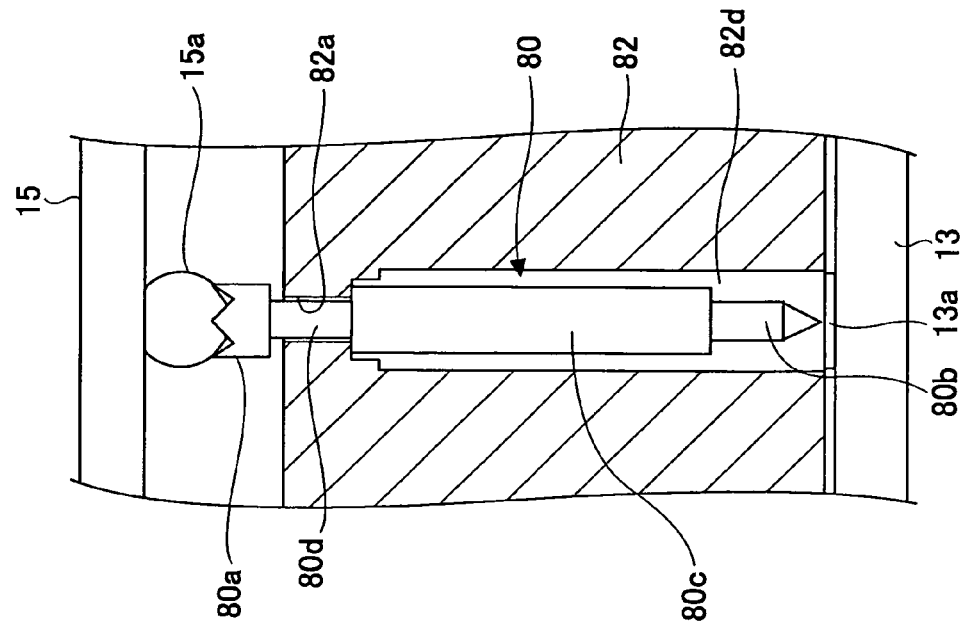
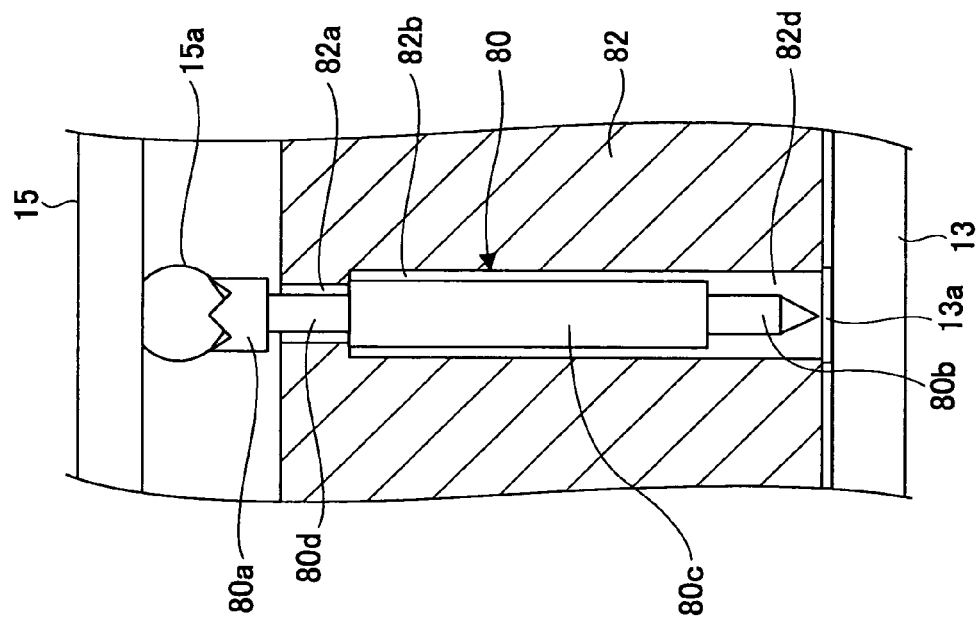

CONTACTOR FOR ELECTRONIC PARTS AND A CONTACT METHOD

BACKGROUND OF THE INVENTION

1. Field of the Invention

The present invention relates to contactors for electronic parts and, more particularly, to a contactor for electronic parts that is used for a characteristic test of electronic parts such as a semiconductor integrated circuit device and a contact method using such a contactor.

2. Description of the Related Art

In recent years, miniaturization, reduction in thickness and reduction in weight of portable electronic equipments (telephones, cameras, personal computers, etc.) have been advanced, and improvement in performance, miniaturization and high-integration have also been advanced with respect to semiconductor integrated circuit devices (hereinafter, referred to as ICs) that constitute electronic circuits of such portable electronic equipments. In many cases, as a form of an IC package, a ball-grid array (BGA) type is used, which has a small pitch of terminals so as to save a space.

Moreover, in the fields such as a high-performance CPU or network equipments (a server or a switchboard), an operation at a higher speed is required. Thus, an attempt has been made to improve a processing speed by high-integration of internal circuits, which causes an increase in electric power consumption.

As a form of an IC package, many input and output electrodes and electrodes for power supply are required, and there is a demand for providing many electrodes in a limited space. Thus, a BGA type package having a larger number of pins is used in many cases.

ICs are subjected to a final inspection which is performed before shipment is in a manufacturing process of the ICs, and ICs judged as non-defective in the final inspection are delivered. In the final inspection, an IC tester is used for performing a characteristic test while supplying an electric power and electric signals from the IC tester so as to make judgment of good or bad of the ICs. A contactor such as an IC socket is used as an interface that connects an IC and the IC tester. The IC is connected to the IC tester through the contactor, and subsequently connected to electric testing circuits of the IC tester.

An example of a conventional contactor is shown in FIG. 1. FIG. 2 is an enlarged view of a part of the contactor shown in FIG. 1.

The contactor comprises a plurality of contact pieces 1 that contact with terminals of an IC. The contacts 1 are arranged in a base 2, and the base 2 is fixed to a substrate 3.

A cover 4 is arranged in the upper portion of the base 2. An opening that receives the IC is provided in the cover 4. By receiving the IC in the opening of the cover 4 and pressing the back surface of the IC, electrode terminals of the IC are brought into contact with the contact pieces 1, which achieves electric conduction.

As each contact piece 1, as shown, for example, in FIG. 2, a probe pin incorporating a coil spring is generally used. It should be noted that an illustration of the cover 4 is omitted in FIG. 2.

The contact pieces 1 are incorporated into the base 2 so that second contact portions 1b of the contact pieces 1 are brought into contact with terminals 3a of the substrate 3 in a continuously pressurized state.

The tests and measurements of the IC 5 are performed while achieving electric contact by causing electrode terminals 5a of the IC 5 to contact with first contact portions of the contact pieces 1 and pressing electrode terminals 5a to the contact pieces 1. Each contact piece 1 has a spring mechanism 1c including a coil spring so that an appropriate contact pressure is achieved by an elastic force of the spring mechanism 1c.

FIG. 3 shows a part of another convention contactor. The conventional contactor shown in FIG. 3 does not have a spring mechanism such as a coil spring, and a contact pin 6 itself is a probe pin constituted by a bent spring. The contact pin 6 itself bends so as to be elastically deformable to achieve a contact pressure.

That is, an end 6b of the needle-like contact pin 6 is fixed to the substrate 3, and a contact portion is provided on the other end so that the contact pin 6 is elastically bent when the electrode terminal 5a of the IC 5 is brought into contact with the contact portion 6a and pressed against the contact portion 6a so as to achieve a contact pressure between the electrode terminal 5a and the contact portion 6a by an elastic returning force.

It should be noted that the end 6b of the contact pin 6 is inserted into a through hole provided in the substrate 3, and is electrically connected to a conductive layer in the through hole (not shown in the figure).

FIG. 4 shows another form of the conventional contactor. In the conventional contactor shown in FIG. 4, a guide plate 7 is elastically supported by a shaft 9 and a coil spring 8 fit on the shaft 9 on a base 2. The shaft 9 penetrates a guide plate 7 and is inserted into the base 2. According to this configuration and arrangement, the guide plate 7 is movable in a vertical direction (directions indicated by arrows in the figure) with respect to the base 2.

First contact parts 1a of contact pieces uprightly held on the base 2 are inserted into holes formed in the guide plate 7 and connected to electrode terminal guiding parts 90. Each of the holes has an inner diameter larger than an outer diameter of each of the first contact portions 1a of the contact pieces 1 as well as each of the electrode terminal guiding parts 90.

In the contactor having the above-mentioned structure, the electrical connection between the electrode terminals 5a of the IC 5 and the first contact portions 1a of the contact pieces 1 can be attained as follows.

First, an IC holding and pressing part 22, which holds the IC 5, is moved, so that the electrode terminals 5a of the IC 5 are positioned substantially above the electrode terminal guiding parts 90. Then, the hold of the IC 5 by the IC holding and pressing part 22 is cancelled and the IC 5 is fallen by gravity so as to cause the electrode terminals 5a of the IC 5 into the respective electrode terminal guiding parts 90.

The electrode terminals 5a of the IC 5 slide into the electrode terminal guiding parts 90 by gravity, and the electrode terminals 5a are brought into contact with the respective first contact parts 1a.

Subsequently, the electrode terminals 5a press the first contact portions 1a of the contact pieces 1 by pressing the IC 5 by the holding and pressing part 22 or other pressing jigs. Consequently, an appropriate contact pressure is obtained according to the elastic forces of the coil springs 8 and spring mechanisms 1c incorporated in the contact pieces 1, and electric connection between the electrode terminals 5a of the IC 5 and the first contact portions 1a of the contact pieces 1 can be obtained.

In each case of the conventional contactors, a direction of deformation of the first contact portion 1a or the contact portion 6a is limited only to a direction substantially the same as the direction of being pressed (a vertical direction in the structure shown in the figures), and a deformation is permitted only a distance corresponding to tolerances of assembly with respect to directions (transverse directions or horizontal directions in the structure shown in the figures) different from the direction of being pressed.

With progress in improvement in performance and miniaturization of electronic parts such as the above-mentioned IC, a number of terminals is increased and a pitch between the terminals is decreased. Thereby, it has become difficult to bring all terminals of an IC into contact with corresponding contact pieces of a contactor with an appropriate positional relationship.

That is, if an attempt is made to arrange the contact pieces of the contactor at positions corresponding to the electrode terminals of the IC, each of the electrode terminals of the IC cannot agree with the corresponding one of the contact pieces since there is a positional error in the positions of the contact pieces and the there also is a positional error in the electrode terminals of the IC. Accordingly, it is difficult to obtain a good contact and there it may be difficult to perform a desired electric test.

Specifically, a large part of the electrode terminals contacts with contact portions of the corresponding contact pieces with low contact resistances, while a part of the electrode terminals is brought into contact with the contact portions of the contact pieces at positions off from the center thereof due to the positional errors of the electrode terminals of the IC and the contact pieces of the contactor, which causes a problem in that the contact is made in a state where only a low contact resistance is achieved.

Although the required position accuracy can be relaxed by increasing an area of the contact portions of the contactor, it is not practical to increase the area of the contact portions since further reduction has been progressed in the pitch of the electrode terminals of the IC.

Moreover, the contact portion of the probe pin type contactor shown in FIG. 2 and FIG. 3 moves only in a vertical direction (longitudinal direction) and hardly movable in a horizontal direction (transverse direction).

For this reason, even if the center of the electrode terminal of the IC and the center of the contact portion of the contact piece do not match each other, a contact must be made in such a state. It is considered that the contact pieces can be moved while accurately recognizing positions of the electrode terminals by image recognition, it is difficult to make positioning by moving each contact piece individually.

Moreover, in the structure shown in FIG. 4, if the weight of the IC 5 is small, there may be a case where the IC 5 stops in the middle of falling due to a friction between the IC 5 and the electrode terminal guiding parts 90 and does not fall to the end by gravity only. In such a case, if the IC 5 is forcibly pressed by the holding and pressing part 22 after the IC 5 is fallen by gravity, the electrode terminals 5a may be damaged due to the pressure to force the electrode terminals 5a to completely contact with the first contact portions 1a despite of misalignment between the electrode terminals 5a and the electrode terminal guiding parts 90 or the first contact portions 1a.

Furthermore, when causing the IC 5 to fall by gravity, the IC 5 is released from the IC holding and pressing part 22 and is caused to fall so as to cause the electrode terminals 5a of the IC 5 to contact with the first contact portions 1a of the contact pieces 1 via the electrode terminal guiding parts 90, which requires a predetermined falling period. Such a falling period is a waste time, and may result in deterioration in work efficiency.

Moreover, in a case where a test measurement is carried out in a state in which not a chip individualized from a wafer but a plurality of devices (chips) are connected with each other such as in a wafer-level CSP (Chip Size Package) or a bump wafer, since the plurality of devices connected with each other are larger in size and heavier than a contactor, it is difficult for the structure shown in FIG. 4 to position the electrode terminals of the devices to the electrode terminal guiding parts 90 or the first contact portions 1a by moving the devices.

Furthermore, although there may be misalignment in the positions of the contact electrodes of the plurality of devices, each of the connected devices cannot be moved individually with respect to the first contact portions 1a of the contact pieces 1. Thus, according to the positioning to move the device side, there may be a case where one of the first contact portions 1a of the contact pieces 1 can be positioned accurately but misalignment cannot be avoided with the first contact portions 1a of other contact pieces 1. Accordingly, it is difficult to make an electrical contact by accurately positioning all of the electrode terminals of a plurality of devices to the first contact portions 1a of the contact pieces 1.

Moreover, with respect to a device having terminal surfaces of both sides or more, such as a POP (Package On Package), etc., since the device cannot be moved after once the contactor is positioned to electrode terminals on one side, electrode terminals on other sides of the device cannot be positioned accurately to other contacts.

SUMMARY OF THE INVENTION

It is a general object of the present invention to provide an improved and useful contactor for electronic parts and contact method in which the above-mentioned problems are eliminated.

A more specific object of the present invention is to provide a contactor for electronic parts and a contact method that can provide an appropriate and uniform contact with respect to a plurality of electrode terminals in an electronic part such as an IC.

In order to achieve the above-mentioned objects, there is provided according to one aspect of the present invention a contactor for electronic parts configured to make an electric connection to a plurality of electrode terminals of an electronic part, comprising: a plurality of contact members each having a first contact portion on one end thereof and a second contact portion on the other end thereof, the first contract portion having a recessed portion that receives one of the electrode terminals of the electronic part; and a base that accommodates and supports the plurality of the contact members, wherein the first contact portion is movable in a horizontal direction.

Additionally, there is provided according to another aspect of the present invention a contactor for electronic parts configured to make an electric connection to a plurality of electrode terminals provided on both main surfaces of an electronic part, comprising: a first contactor configured to make a contact with the electrode terminals provided on one of the main surfaces of the electronic part, the first contactor including: a plurality of first contact members each having a first contact portion on one end thereof and a second contact portion on the other end thereof, the first contract portion having a recessed portion that receives first one of the electrode terminals of the electronic part; and a first base that accommodates and supports the first contact members, wherein the first contact portion is movable in a horizontal direction; and a second contactor configured to make a contact with the electrode terminals provided on the other of the main surfaces of the electronic part, the second contactor including: a plurality of second contact members each having a third contact portion on one end thereof and a fourth contact portion on the other end thereof, the third contract portion having a recessed portion that receives second one of the electrode terminals of the electronic part; and a second base that accommodates and supports the second contact members, wherein the third contact portion is movable in a direction substantially perpendicular to a direction toward the second one of the electrode terminals of the electronic part.

Additionally, there is provided according to another aspect of the present invention a contact method of making electrical connection to a plurality of electrode terminals of an electronic part, comprising: pressing the electrode terminals against recessed portions in contact portions of contract members so as to move the contract portions by a component force of a pressing force generated by the pressing, the component force directed in a direction substantially perpendicular to a direction of the pressing force; and causing the electrode terminals to be received in the recessed portions with a center of each of the electrode terminals in a transverse direction being aligned with a center of a corresponding one of the recessed portions of the contact portions.

Further, there is provided according to another aspect of the present invention a contact method of making electrical connection to a plurality of electrode terminals of an electronic part, the electrode terminals provided on both main surfaces of the electronic part, the contact method comprising: pressing the electrode terminals provided on one of the main surfaces of the electronic part against first recessed portions in first contact portions of first contract members so as to move the first contract portions by a component force of a pressing force generated by the pressing, the component force directed in a direction substantially perpendicular to a direction of the pressing force; causing the electrode terminals to be received in the first recessed portions with a center of each of the electrode terminals in a transverse direction being aligned with a center of a corresponding one of the first recessed portions of the first contact portions; pressing the electrode terminals provided on the other of the main surfaces of the electronic part against second recessed portions in second contact portions of second contract members so as to move the second contract portions by a component force of a pressing force generated by the pressing, the component force directed in a direction substantially perpendicular to a direction of the pressing force; and causing the electrode terminals to be received in the second recessed portions with a center of each of the electrode terminals in a transverse direction being aligned with a center of a corresponding one of the second recessed portions of the second contact portions.

As mentioned above, according to the present invention, an appropriate and uniform contact can be made to a plurality of terminals in an electronic part such as an IC.

Other objects features and advantages of the present invention will become more apparent from the following detailed description when read in conjunction with the accompanying drawings.

BRIEF DESCRIPTION OF THE DRAWINGS

FIG. 16 is a perspective view of a contactor according to a third embodiment of the present invention;

FIGS. 17A and 17B are illustrations of a variation of a first contact portion;

FIGS. 18A and 18B are illustrations of a variation of a first contact portion;

FIGS. 19A and 19B are illustrations of a variation of a first contact portion;

FIG. 25 is an illustration showing a state where a base is moved downward and a contact piece is brought into contact with an electrode terminal of an upper side of an IC;

FIG. 26 is an illustration showing a state where the electrode terminal enters inside the first contact portion;

FIG. 27 is an illustration showing a state where a terminal of a substrate is brought into contact with a second contact portion of a contact piece and a contact is completed;

FIG. 28 is an illustration of an example in which a through hole for accommodating a probe pin type contact piece is intentionally enlarged;

FIG. 29 is an illustration showing a structure in which a contact position of a first contact portion is moved by the probe pin type contact piece shown in FIG. 27 being slanted;

DETAILED DESCRIPTION OF THE PREFERRED EMBODIMENTS

A description will now be given, with reference to the drawings, of embodiments according to the present invention.

Figure 1:
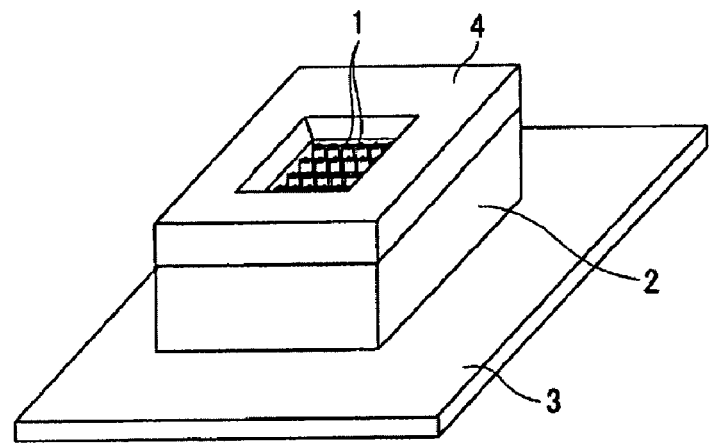
FIG. 1 is a perspective view of a conventional contactor.
Figure 2:
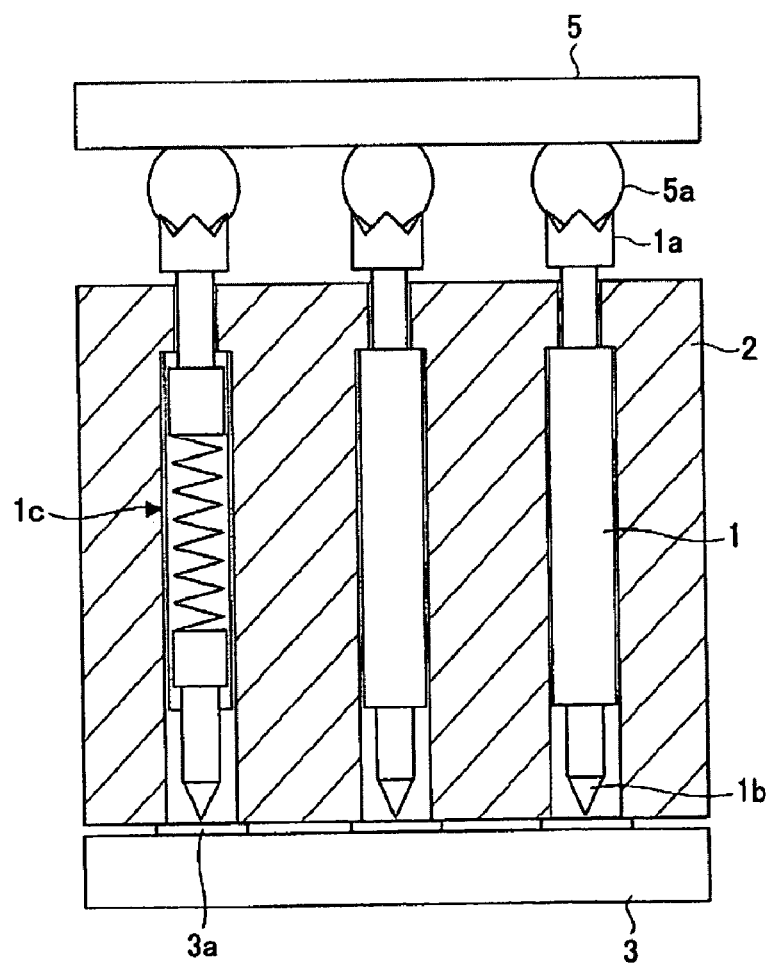
FIG. 2 is an enlarged cross-sectional view of a part of the contactor shown in FIG. 1.
Figure 3:
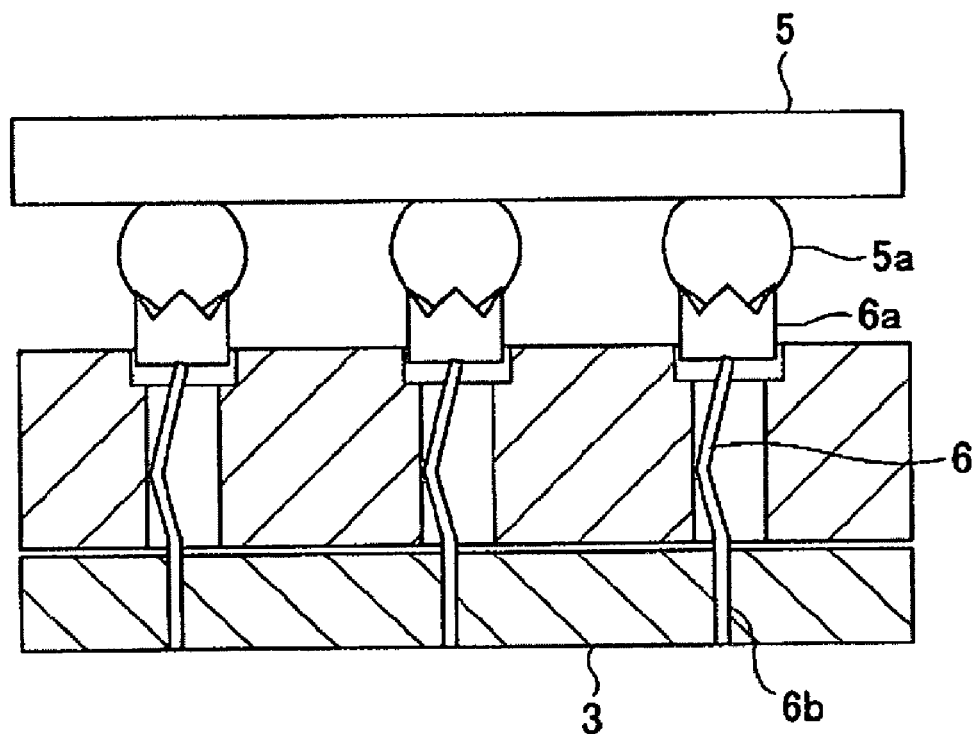
FIG. 3 is a cross-sectional view of another conventional contactor.
Figure 4:
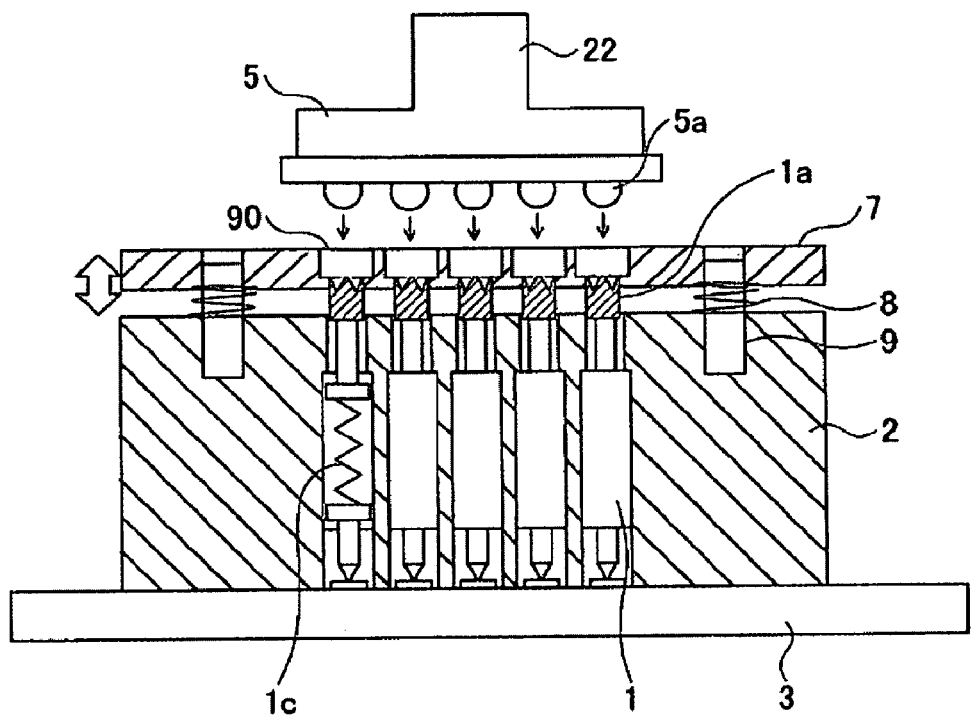
FIG. 4 is a cross-sectional view of a part of yet another conventional contactor.
Figure 5:
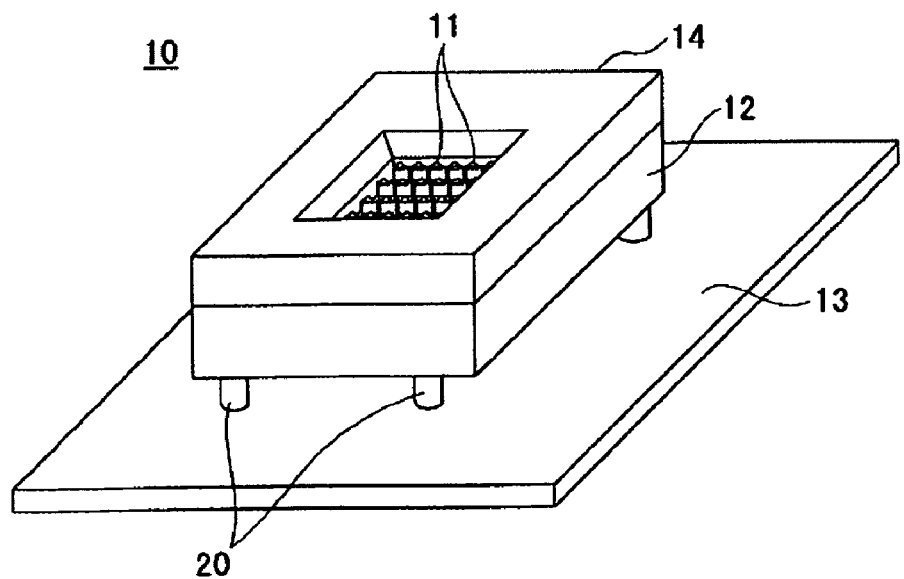
FIG. 5 is a perspective view of an entire structure of a contactor according to a first embodiment of the present invention.

First, a description will be given, with reference to FIG. 5 through FIG. 12, of a contactor according to a first embodiment of the present invention. FIG. 5 shows an entire structure of the contactor 10 according to the first embodiment of the present invention.

The contactor 10 according to the first embodiment of the present invention comprises a plurality of contact pieces 11 that are brought into contact with external connection electrode terminals of a semiconductor integrated circuit device (hereinafter, referred to as IC) as an electronic part. The contact pieces 11 are arranged in a base 12, and a cover is provided in an upper portion of the base 12.

An opening into which an IC 15 as an electronic part (refer to FIG. 6) is inserted is formed in the cover 14. The IC 15 is accommodated in the opening of the cover 14 with a surface where electrode terminals 15a are formed facing downward. The electrode terminals 15a are brought into contact with the contact pieces 11 by pressing the IC 15 via the cover 14 so as to achieve an electric contact.

The base 12 is preferably formed of a plastic material, and, for example, liquid crystal polymer (LCP), polyamide resin or polyether ether ketone (PEEK) may be used. A for the substrate 13, an insulating substrate such as a ceramic substrate, a glass-epoxy substrate, or the like may be used.

The base 12 holding the contact pieces 11 is movably supported in a vertical direction by a plurality of shafts 20 perpendicularly provided to the substrate 13.

Figure 6:
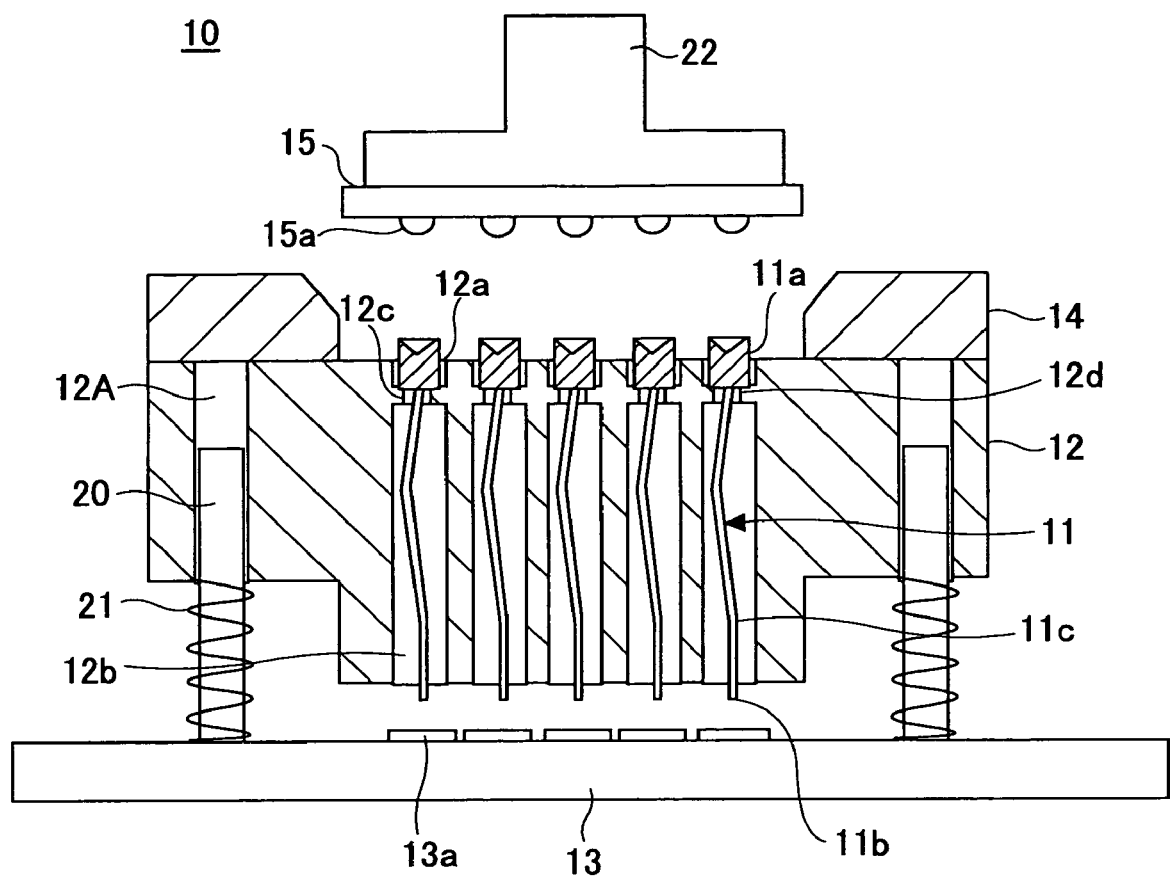
FIG. 6 is a cross-sectional view of the contactor in a state before an IC is attached.
Figure 7:
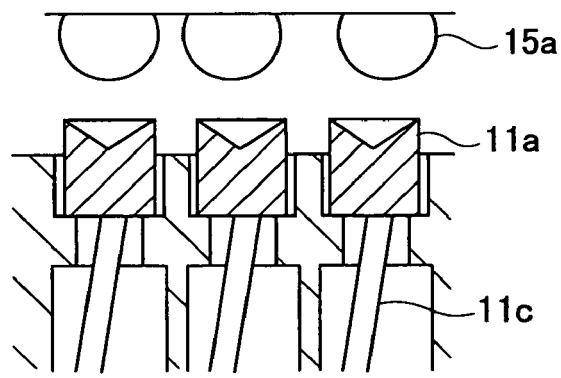
FIG. 7 is an illustration for explaining a positional relationship between electrode terminals of the IC and contact portions of contact pieces of the contactor shown in FIG. 6.

FIG. 6 shows the contactor 10 in a state before the IC 15 is accommodated. FIG. 7 shows a positional relation between the electrode terminals 15a of the IC 15 and the contact portions 11a of the contact pieces 11 in the contactor 11.

As shown in FIG. 6, each of the contact pieces 11 comprises a contact pin 11c and a first contact portion 11 provided in an upper portion other contact pin 11c. The lower end of the contact pin 11c serves as a second contact portion 11b which is brought into contact with a terminal 13a formed and arranged on the substrate 13. The contact pin 11c is bent beforehand in an elbow shape so as to be easily deformed when being pressed from both ends.

Although it is preferable to form the contact pin 11 by an elastic material having conductivity such as beryllium copper with gold plating. As other materials, for example, a gold alloy, a platinum base alloy or a palladium base alloy can also be used.

In the above-mentioned structure, a plurality of shafts 20 are provided to extend vertically from the substrate 13, and coil springs 21 are fit around the shafts 20, respectively. The base 12 has through holes at positions corresponding to the shafts 20. The shafts 20 are inserted into the through holes 12A, respectively, so that the base 20 is elastically supported by the coil springs 21. In an unloaded condition, the base 12 is supported by the coil springs 21 and held at a position separate from the substrate 13.

The contact portion 11a of each contact piece 11 is accommodated in a contact portion holes 12a formed in the base 12, and the contact pin 11c is accommodated in a contact pin hole 12b. An isolation wall portion 12c is provided between the contact portion hole 12a and the contact pin hole 12b. A connection hole 12d is formed in the isolation wall portion 12c. The connection hole 12c has an inner diameter smaller than an outer diameter of the first contact portion 11a of the contact piece 11 but larger than an outer diameter of the contact pin 11c.

Additionally, the contact pin hole 12b is formed to have a large space so as to allow deformation, bowing or rotation of the contact pin 11c. Accordingly, by inserting the contact pin 11c of the contact piece 11 into the contact pin hole 12b through the connection hole 12d from the side of the contact portion hole 12a, the contact pin 11c is accommodated in the contact pin hole 12b, and the first contact portion 11a is accommodated in the contact portion hole 12a. A length of the contact pin 11c is set so that a predetermined length of the second contact portion 11b protrudes from the contact pin hole 12b.

Here, the inner diameter of the contact portion hole 12a in which the first contact portion 11a of the contact piece 11 is accommodated is set to be larger than the outer diameter of the first contact portion. Thus, there is provided a sufficiently larger gap between the outer surface of the first contact portion 11a and the inner surface of the contact portion hole 12a than a gap formed by dimensional tolerances. Accordingly, in the state shown in the figure, the first contact portion 11a is movable in a transverse direction within the contact portion hole 12a.

That is, as shown in the figure, when the IC 15 to be tested is preset in a direction in which the contact pin 11 extends, the first contact portion 11a moves in a transverse direction if a component force in a direction substantially perpendicular to a pressing direction (in a transverse direction in the state shown in the figure) is generated in the first contact portion 11a of the contact pin 11. Accordingly, according to the self-alignment of the contact piece 11 due to the movement of the first contact portion 11a, positioning between the first contract portion 11a and the IC 15 to be tested, that is, a centering process is achieved.

The electrode terminals 15a of the IC 15 are generally spherical or hemispherical electrode terminal formed by solder balls or the like. The solder balls are received in conically recessed portions formed on an end surface (top surface) of the first contact portion 11a, and the surface thereof contact with a tapered inner surface of the recessed portions. Accordingly, if the plurality of electrode terminals 15a in the IC 15 are not arranged with a uniform pitch therebetween, the contact can be made without problem due to the effect of the present invention.

Figure 9:
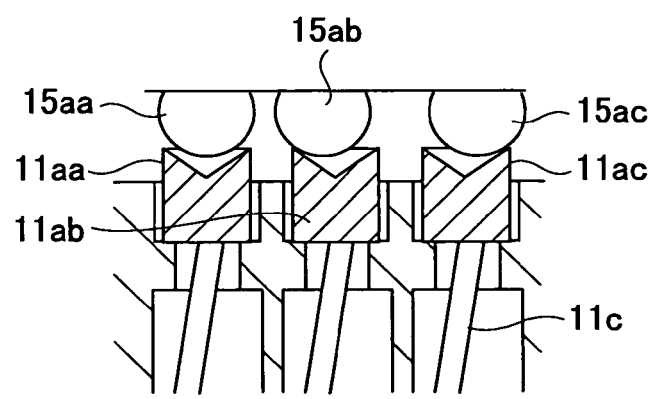
FIG. 9 is an illustration for explaining a positional relationship between the electrode terminals of the IC and the contact portions of the contact pieces of the contactor shown in FIG. 8.

That is, for example shown in FIG. 9, from among the three electrode terminals 15a, the electrode terminal 15aa is substantially the same as the position of the corresponding first contact piece 11aa, but the central electrode terminal 15ab is slightly off to the side of the electrode terminal 15aa and is off to the left side with respect to the first contact portion 11ab of the corresponding contact piece 11. Additionally, the electrode terminal 15ac on the right side is off from the position of the first contact portion 11ac of the corresponding first contact portion 11ac.

That is, at the stage where the electrode terminals 15a of the IC 15 are brought into contact with the first contact portions of the contact pieces 11, the positional relationship and contact condition between the plurality of electrode terminals 15a and the plurality of contact portions 11a differ from each other.

Figure 10:
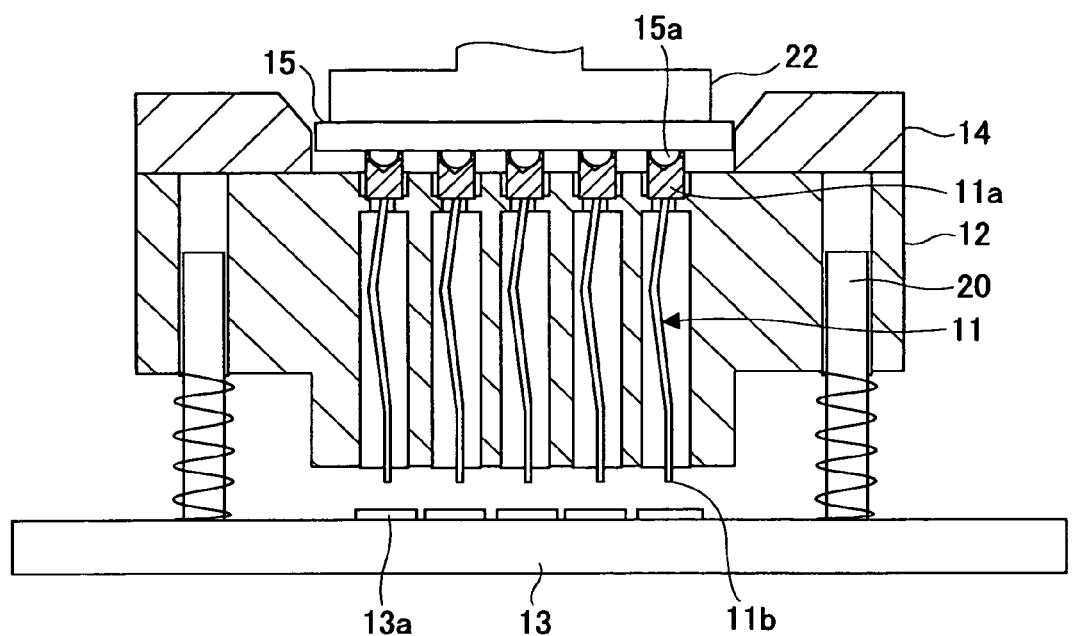
FIG. 10 is a cross-sectional view of the contactor in a state where the electrode terminals of the IC are in complete contact with the contact pieces.
Figure 11:
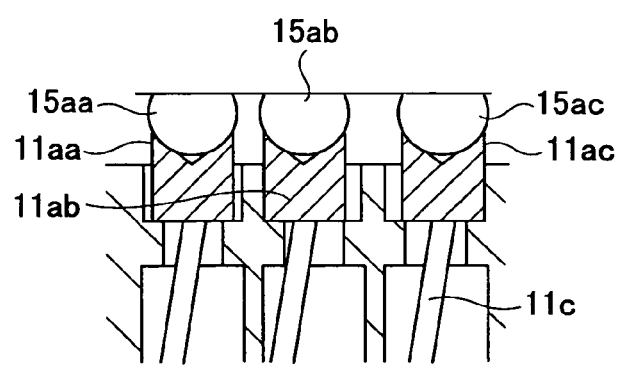
FIG. 11 is an illustration for explaining a positional relationship between the electrode terminals of the IC and the contact portions of the contact pieces of the contactor shown in FIG. 10.

According to the structure of the present embodiment, if the IC 15 is moved further downward, as shown in FIG. 10 and FIG. 11, the plurality of terminal electrodes 15a are received in the conically recessed portions of the respective first contact portions 11a. This is because the first contact portions 11a are movable in a direction substantially perpendicular to the direction in which the IC 15 to be tested is pressed as mentioned above. That is, the first contact portion 11ac corresponding to the electrode terminal 15ac on the right side moves right word due to a transverse direction component of the pressing force exerted by the electrode terminal 15ac onto the inner surface of the conically recessed portion. Accordingly, the electrode terminal 15ac is received by the conically recessed portion of the first contact portion 11ac.

Similarly, the first contact portion 11ab corresponding to the electrode terminal 15ab at the center also moves leftward due to a transverse direction component of the pressing force exerted by the electrode terminal 15ab onto the inner surface of the conically recessed portion. Accordingly, the electrode terminal 15ab is received by the conically recessed portion of the first contact portion 11ab.

That is, a position offset in each of the plurality of electrode terminals 15a is absorbed by the corresponding one of the first contact portions 11a, and each of the electrode terminals 15a is appropriately received by the respective conically recessed portion. Accordingly, all the electrode terminals 15a of the IC 15 to be tested match in their positions with the first contact portions 11a of the contactor 10, which achieves a good contact condition for all of the electrode terminals 15a.

Each terminal electrode 15a received in the recessed portion with the center axis of a transverse direction (direction of width) of an outer configuration in the electrode terminal 15a of the IC 15 being matched with the center axis of a transverse direction (direction of diameter) of the conically recessed portion of the first contact piece 11a is brought into contact with the inner surface of the conically recessed portion of the corresponding first contract piece 11a. Thus, according to the present embodiment, there is generated no point contact condition, which achieves a contact with a lower contact resistance.

As mentioned above, what enables the movement of the first contract portion 11a, that is, the centering function, is that the contact piece 11 is accommodated and supported by the base 12 by intentionally setting a large size difference between the outer diameter of the first electrode portion 11a of the contact piece 11 and the inner diameter of the contact piece hole 12b in the base 12 so as to provided a freedom of movement with respect to the contact piece 11.

It should be noted that, in the state shown in FIG. 10 and FIG. 11, the second contact portion 11b of the end of the contact pin 11c of the contact piece 11 is not in contact with the terminal 13a provided in the substrate 13 and has a large freedom. Thus, a freedom of movement of the contact piece 11 is large, which enables easy movement of the first contact portion 11a in a horizontal direction. Additionally, if the second contact portion 11b of the end of the contact pin 11c is in contact with the terminal 13a, the contact piece 11 can be moved with a contacting portion as a supporting point, thereby maintaining a degree of freedom in movement of the contact piece 11.

By further moving the IC 16 downward from the state shown in FIG. 10 and FIG. 11, the springs 21 are compressed by the pressing force via the IC 15 and the base 12 moves downward. Then, as shown in FIG. 11, the second portions of the contact pieces 11 are finally brought into contact with the terminals 13a provided on the substrate 13, and, thus, the IC 15 is electrically contacted with the substrate 13. In the state shown in FIG. 12, electric power and electric signals are supplied through the substrate so as to perform a final test (electric test) of the IC 15.

As mentioned above, according to the present embodiment, when terminals of an electronic part such as an IC are brought into contact with contact pieces of a test apparatus, the contact pieces are moved to appropriate positions in response to a pressing force, which achieves automatic centering. Accordingly, the present embodiment is applicable to electrode terminals arranged at a small pitch without using a complicated centering mechanism or the like. As a result, the contact pieces of the test apparatus can make good contact with all terminals of the electric part, which enables a good electric test of the electronic part.

Figure 13:
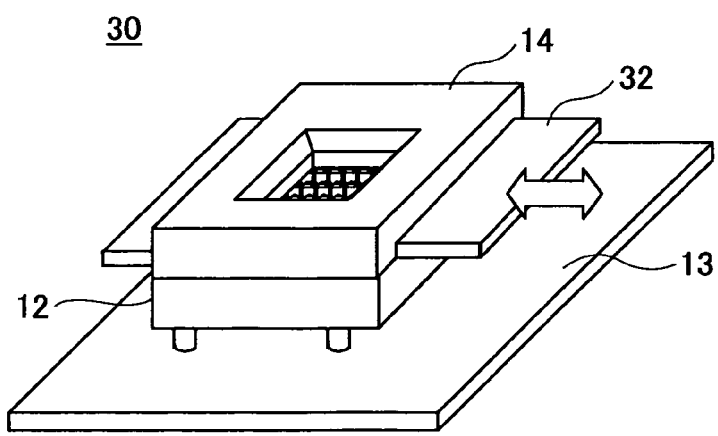
FIG. 13 is a perspective view of a contactor according to a second embodiment of the present invention.
Figure 14:
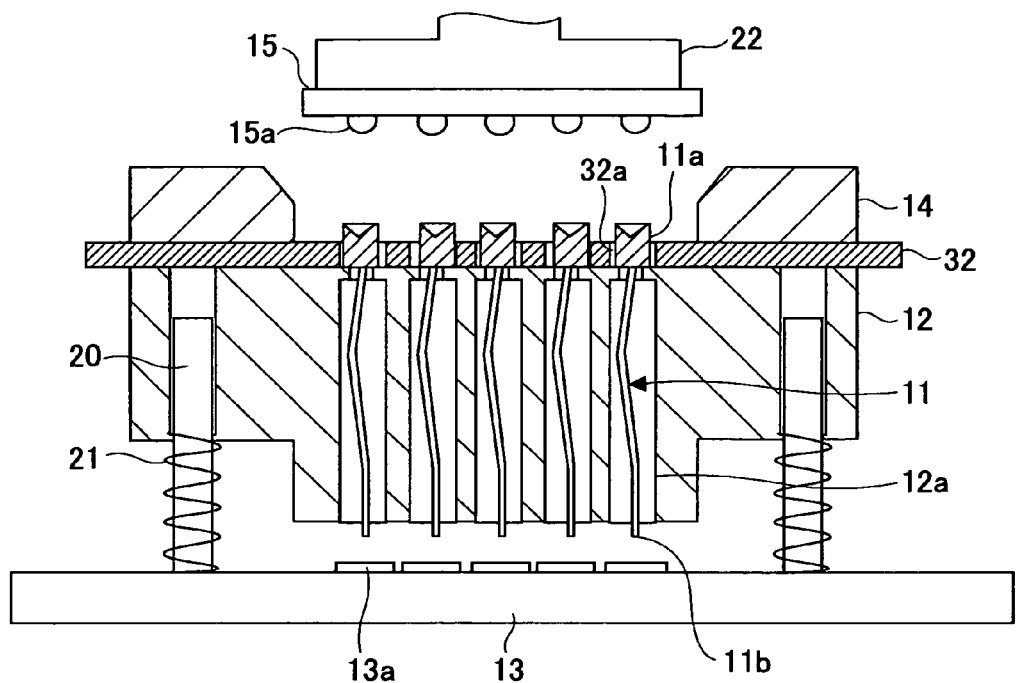
FIG. 14 is a cross-sectional view of a contactor according to a second embodiment of the present invention.
Figure 15:
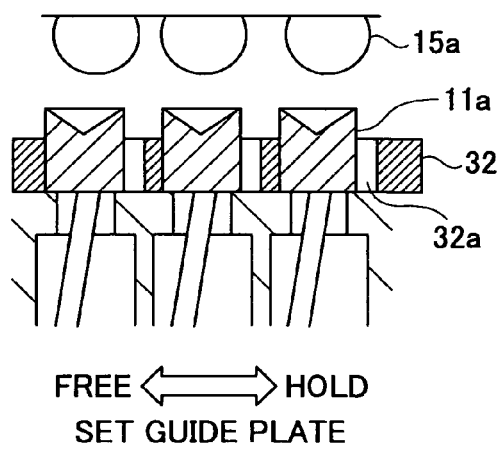
FIG. 15 is an illustration for explaining a function of a guide plate shown in FIG. 14.

A description will be given, with reference to FIG. 13 through FIG. 15, of a second embodiment of the present invention. FIG. 13 is a perspective view of a contactor 30 according to the second embodiment of the present invention. FIG. 14 is a cross-sectional view of the contactor 30 according to the second embodiment of the present invention. In FIG. 13 and FIG. 14, parts that correspond to the parts shown in FIG. 5 and FIG. 6 are given the same reference numerals, and descriptions thereof will be omitted.

Figure 12:
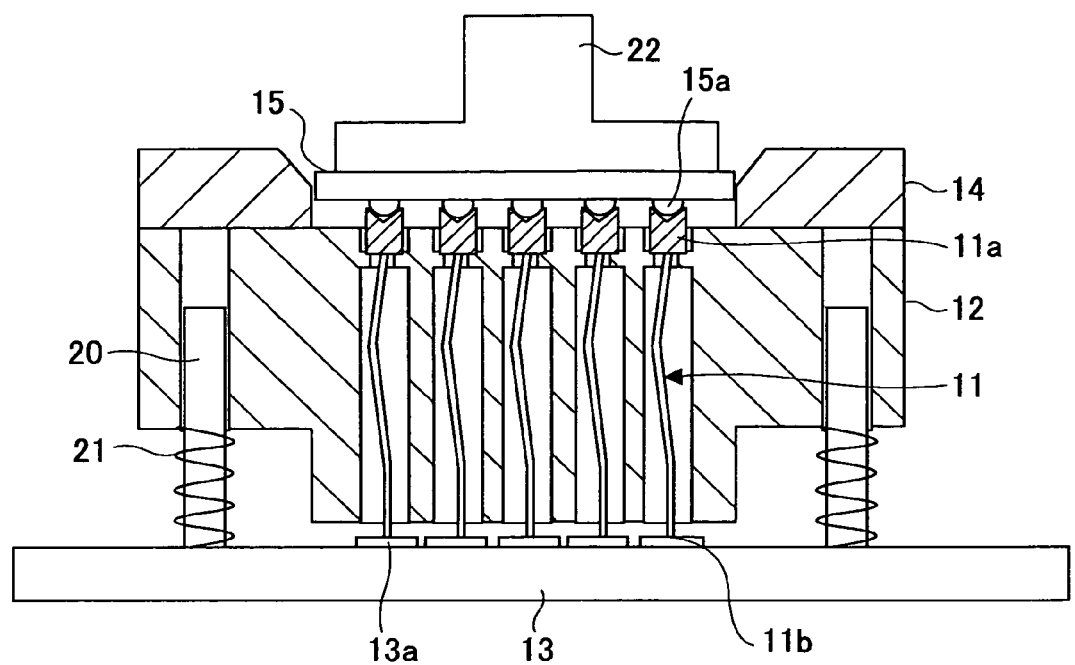
FIG. 12 is a perspective view of the contactor in a state where the IC is completely incorporated.

The contactor 30 according to the second embodiment is not provided with contact portion holes 12a in the base 12, as shown in FIG. 12 and FIG. 13, and, instead, a guide plate 32 is provided above the base 12. The guide plate 32 is positioned between the base 12 and cover 14, and is movable in a transverse direction.

Contact portion holes 32a are provided in the guide plate 32 in accordance with the contact pin holes 12b provided in the base 12. Thus, the contact portion holes 32a are provided in accordance with the contact portions 11a of the contact pieces 11.

In the contactor according the above-mentioned first embodiment, each contact portion hole 12a is larger than each contact portion 11a, and when the first contact portions 11a are at arbitrary positions in the contact portion holes 12a, the positions of the electrode terminals 15a and the positions of the first contact portions 11a of the contact pieces 11 fluctuate largely in an initial state of contact. If an amount of offset in the positions is extremely large, it may be possible that the electrode terminals 15a cannot be received by the conically recessed portions of the first contact portions 11a.

On the other hand, in the contactor 30 according to the present embodiment, the guide plate is moved by a predetermined distance in one direction (rightward direction in FIG. 15) at an initial stage, that is, before the IC 15 to be tested is accommodated so as to establish an aligned state where the plurality of first contact portions are slightly moved in one direction (the direction in which the guide plate 32 is moved). In this state, the plurality of first contact portions 11a are arranged in accordance with the positions of the contact portion holes 32a in the guide plate 32, thereby correcting dispersion of the positions.

Then, the guide plate 32 is slightly moved in a direction (leftward direction in FIG. 15) opposite to the above-mentioned direction so as to be at a predetermined position so that a state is established where each of the first contact portions 11a is not in contact with the inner surface of the contact portion hole 32 in which the first contact portion is accommodated. As a result the first contact portions 11a are movable in any transverse direction in the contact portion holes 32a of the guide plate 32.

Thereafter, the IC 15 to be tested is moved downward to as to be accommodated in the opening, and the electrode terminals 15a are brought into contact with the corresponding first contact portions 11a. At this time, each of the electrode terminals 15a aligns with the respective one of the first contact portions 11a that have been appropriately arranged. When the IC 15 further moves downward, each of the contact portions 11a moves in accordance with the position of the corresponding electrode terminal 15a, thereby receiving the electrode terminals 15a in the conically recessed portions.

Figure 8:
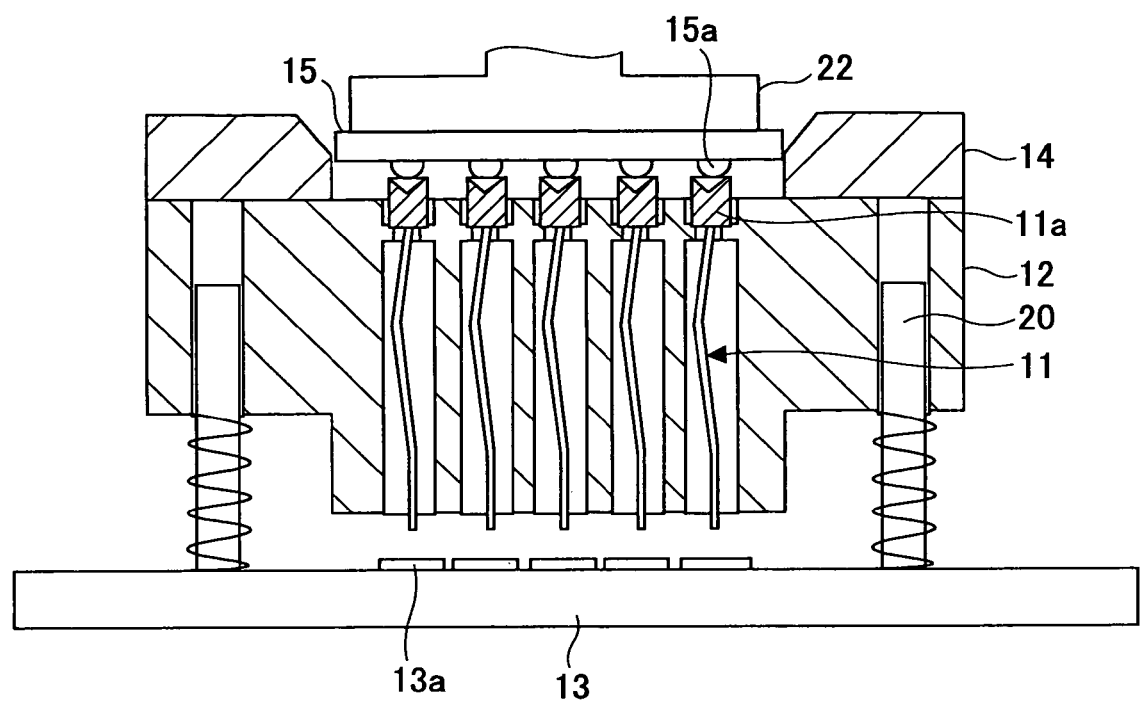
FIG. 8 is a cross-sectional view of the contactor in a state where the electrode terminals of the IC are in contact with the contact pieces.

It should be noted that a timing for moving the guide plate in the direction opposite to the direction of the initial state may be a time when the electrode terminals 15a of the IC 15 are moved a position or close to the position where the electrode terminals 15a are brought into contact with the first contact portions 11 as shown in FIG. 8. Additionally, the amount of movement of the guide plate 32 in the initial stage can be determined appropriately, the final position in the movement can be set at a time when the contact pieces 11c made a contact with the isolation wall portions 12c of the base 12.

A description will be given, with reference to FIG. 16, of a contactor according to the third embodiment of the present invention.

The contactor 40 according to the third embodiment has an actuator 42, which gives a vibration to the base 12. The actuator 42 is constituted by, for example, an ultrasonic vibrator or a mechanical vibrator. The actuator 42 is operated for a period from a time when the electrode terminals 15a of the IC 15 to be tested begun to make a contact with the first contact portions 11a of the contact pieces 11 and until a final contact state is established so as to give a vibration to the base 12.

According to the base being vibrated, the first contact portions 11a are also vibrated. Thereby, coefficient of friction between the first contact portions 11a and the base 12 is reduced apparently, and the first contact portions 11a have become easily movable. That is, by giving a vibration to the base 12, it becomes possible to easily perform the positioning according to the self-alignment between the first contact portions 11a and the electrode terminals 15a and to easily receive the electrode terminals 15a by the first contact portions 11a.

The actuator 42 can be applied to each of the above-mentioned first embodiment and second embodiment.

In the above-mentioned first through third embodiments, each of the recessed portions provided in the first contact portions 11c is formed in a conical shape. However, the shape of the recessed portion is not limited to the conical shape, and any other shapes may be used is they can receive the electrode terminal and gives a centering function.

For example, as shown in FIGS. 17A and 17B, the recessed portion may have a form in which a fringe is provided in the periphery of a conical recess. FIG. 17A is a perspective view of the first contact portion 11a-1, and FIG. 17B is a cross-sectional view of the first contact portion 11a-1.

Additionally, as shown in FIGS. 18A and 18B, the recessed portion may have a form provided with four protrusions each having a slanting surface. FIG. 18A is a perspective view of the first contact portion 11a-2, and FIG. 18B is a cross-sectional view of the first contact portion 11a-2.

Further, as shown in FIGS. 19A and 19B, the recessed portion may have a form of two quarter circles laminated with each other in opposite positions. FIG. 19A is a perspective view of the first contact portion 11a-3, and FIG. 19B is a cross-sectional view of the first contact portion 11a-3.

As mentioned above, by forming the recessed portion provided to the first contact portion 11c to a shape that can easily receive the electrode terminal, each contact piece can move individually for position correction with respect to misalignment of each electrode terminal, thereby obtaining a contact of the both in a stated where accurate positioning is made with respect to all of the electrode terminals.

A description will now be given, with reference to FIG. 20 and FIG. 21, of a fourth embodiment of the present invention.

A contactor 50 according to the fourth embodiment of the present invention is a contactor for making a contact with an electronic part such as an IC provided with electrode terminals on both a top surface and a bottom surface (a front surface and a back surface) such as a POP (Package On Package).

Figure 20:
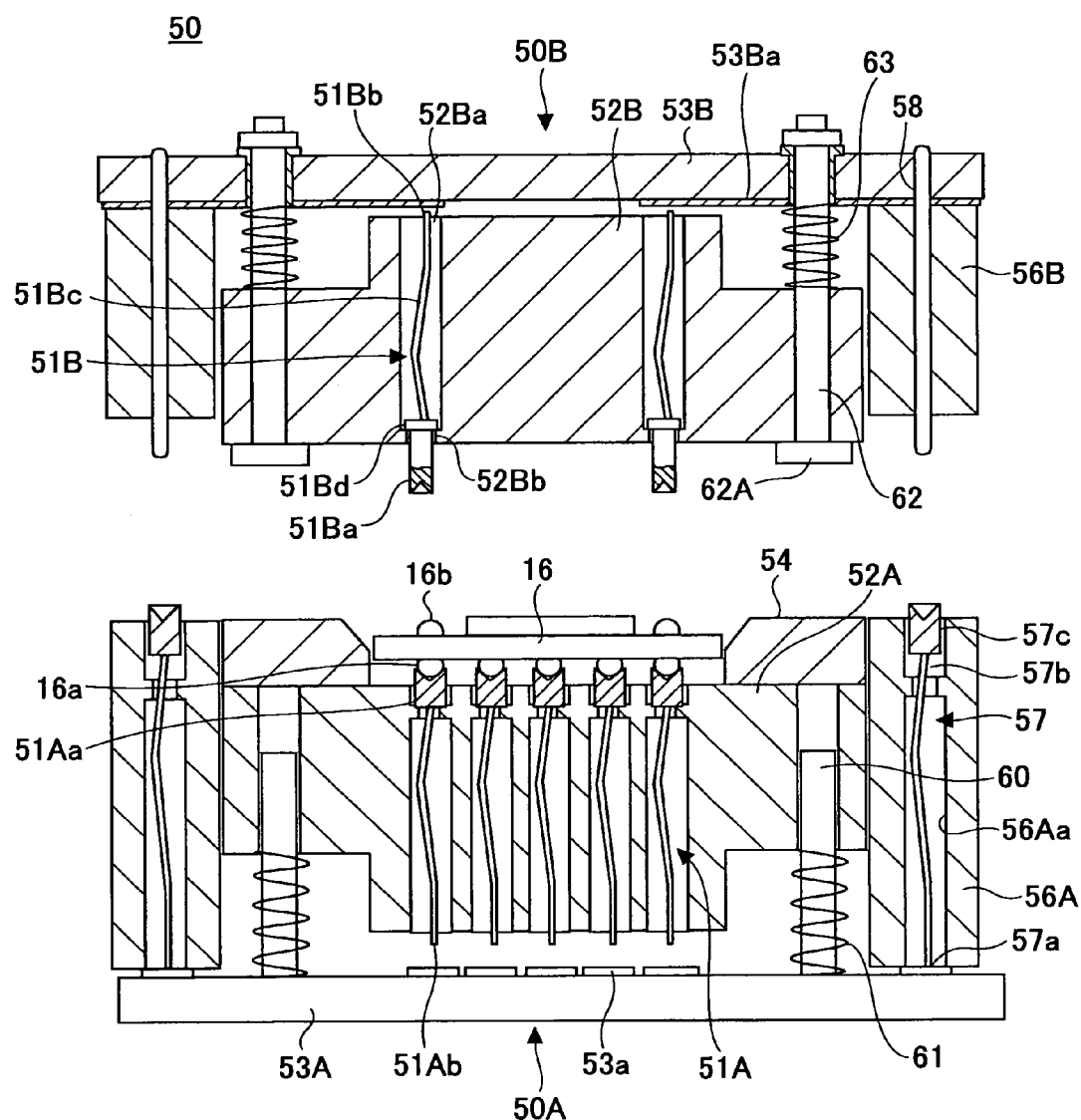
FIG. 20 is a cross-sectional view of a contactor according to a fourth embodiment of the present invention in a state before a contact is made.
Figure 21:
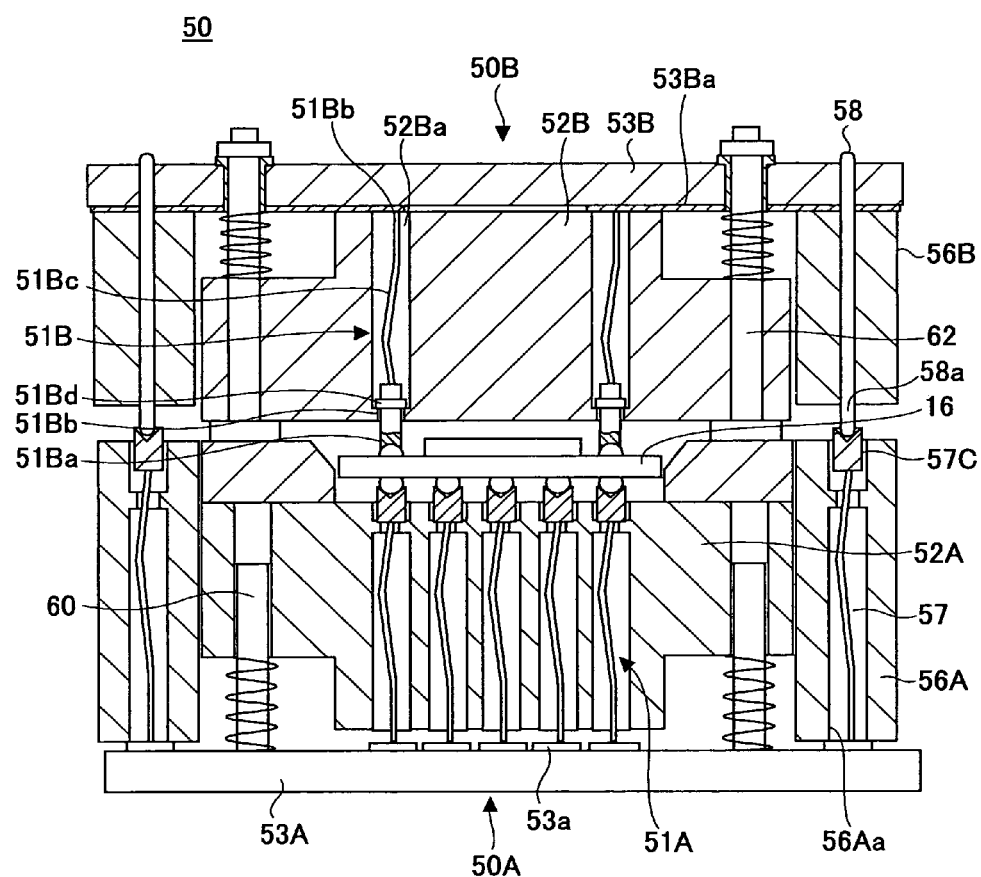
FIG. 21 is a cross-sectional view of the contactor according to the fourth embodiment of the present invention in a state after a contact is made

FIG. 20 shows a state of the contactor 50 before making contact with an IC to be tested. FIG. 21 shows a state of the contactor 50 after making contact with the IC to be tested.

In the structure of the contactor shown in FIG. 20, a lower-side contactor 50A, which makes a contact with the electrode terminals 16a on the bottom surface of the IC 16 to be tested, has a structure the same as the contactor 10 of the above-mentioned first embodiment. The lower-side contactor 50A comprises contact pieces 51A, a base 52A, a substrate 53A and a cover 54.

In the structure of the contactor, in addition to the above-mentioned lower side contactor 50A, there is provided au upper-side contactor 50B which makes a contact with the electrode terminals 16b provided on the top surface of the IC 16 to be tested. Similar to the above-mentioned lower-side contactor 50A, a base 52B of the upper-side contactor 50B is guided by shafts 62 vertically extending from a substrate 53B, and is movably supported in upward and downward directions by springs 63.

Each of the contact pieces 51B of the upper-side contactor 50B comprises a third contact portion 51Ba on the bottom side, a collar portion 51Bd formed on an upper end portion of the third contact portion 51Ba, and a contact pin 51Bc extending from the collar portion 51Bd upward. The contact pin 51Bc is formed in an elbow shape so as to be easily bent, and an extreme end (upper end) 51Bb thereof serves as a fourth contact portion.

The collar portion 51Bd and the contact pin 51Bc are accommodated in a contact pin hole 52Ba formed in the base 52B. The contact pin hole 52Ba has an inner diameter larger than an outer diameter of the collar portion 51Bd, and an inner diameter of a contact portion hole 52Bb, into which the third contact portion 51Ba is inserted, is set larger than an outer diameter of the third contact portion 51Ba.

Thus, similar to the contact piece 51A of the lower-side contactor 50A, the third contact portion 51Ba is movable in a transverse direction in the contact portion hole 52Bb. That is, when making contact with the electrode terminals 16b of the IC 16, the third contact portion 51Ba moves in a transverse direction in accordance with the position of the electrode terminal 16b, and the electrode terminals 16 can be received by the conically recessed portion.

By supporting the collar portion 51Bd of the contact piece 51B by the isolation wall 52Bb of the base 52B, the contact piece 51B can be held without falling off from the base 52B.

Moreover, in the above-mentioned contactor 50, a contact mechanism is provided around the lower-side contactor 50A and around the upper-side contactor 50B so as to making an electrical connection between the electrode terminals 16b and 16a of the IC 16 to be tested through the substrate 53B of the upper-side contactor 50B and the substrate 53A of the lower-side contactor 50A. The contact mechanism provided around the lower contactor 50A comprises a frame-like base 56A and contact pieces 57 each having a generally elbow shape. The frame-like base 56 is provided on the substrate 53A. Each contact piece 57 is accommodated in a hole 56Aa provided in the base 56A. The contact mechanism provided around the upper-side contactor 50B comprises a frame-like base 56B provided in the substrate 53B and probe pins 58 supported by the base 56B.

In the lower-side substrate 53A, an electrode 53a extend to one end (lower end) 57a of the contact piece 57. On the other hand, contact portion 57c having conically recessed portion is provided on the other end of the contact piece 57.

Additionally, in the upper-side substrate 53B, a conductive pattern 53Ba is provided on a surface opposite to the base 52. One end of the conductive pattern 53 is connected to the probe pin 58 and the other end extends to an end portion 51Bb of the contact piece 51B.

In the above-mentioned contactor mechanism, when the substrate 53B is moved downward (pressed down) after the IC 16 to be tested is accommodated in an opening of the cover 54 of the lower-side contactor 50A, the base 52B also moves downward in an initial stage. However, when an end portions 62A of he shafts 62 make a contact with the cover 54 of the lower-side contactor 50A, the substrate 53B, the base 56B and the probe pin 58 move downward while compressing the springs 63. After the substrate 53B makes a contact with the base 52B, the base 52A of the lower-side contactor 50A moves downward together with the substrate 53B and the base 52B. After completion of the contact, a state shown in FIG. 20 is established.

When the upper-side contactor 50B moves downward and the contact is achieve as shown in FIG. 20, the lower ends of the probe pins 58 of the upper-side contactor 50B are received in the conically recessed portions of the contact portions 57c of the contact pieces 57 of the lower-side contactor 50A.

Thus, the electrode wiring of the substrate 53B of the upper-side contactor 50B and the electrode wiring of the substrate 53A of the lower-side contactor 53A are electrically connected to each other. Additionally, these electrode wirings are electrically connected to the electrode terminals 16a and 16b of the IC 16 through the contact pieces 51A and the contact pieces 51B. Accordingly, electric signals for testing and drive electric power can be supplied simultaneously to electrode terminals provided on the both surfaces of the IC having the electrode terminals on both the front and back surfaces (top and bottom surfaces).

It should be noted that the external connection terminals (not shown in the figure) for the electric signals for testing and the drive electric power may be provided to one of the substrate 53A and the substrate 53B.

Here, a description will be given of an advantage of the centering function by self-alignment being provided both the lower-side contactor 50A and the upper-side contactor 50B.

In the IC 16 provided with electrode terminals 16a and 16b on both the top and bottom surfaces (front and back surfaces), the electrode terminals 16a formed on the bottom surface and the electrode terminals 16B formed on the top surface are preferably in an accurately corresponding positional relationship. However, there may occur an error in the positional relationship due to influences such as that the electrode terminals 16a and the electrode terminals 16b are formed in different processes.

Even in such a case, each of the contact pieces 51A and the contact pieces 51B of the upper-side and the lower-side contactors can move to appropriate contact positions in response to the corresponding electrode terminals 16a and 16b, and, thereby, an appropriate contact condition can be achieved with respect to the electrode terminals 16a and 16b of both the front and back surfaces.

Figure 23:
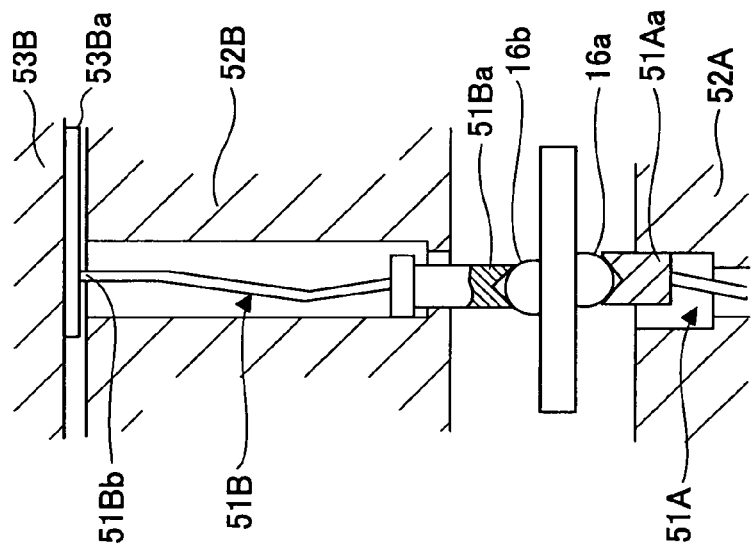
FIG. 23 is an illustration showing a position of the contact piece relative to the electrode terminal in a state where the contact operation is completed.
Figure 22:
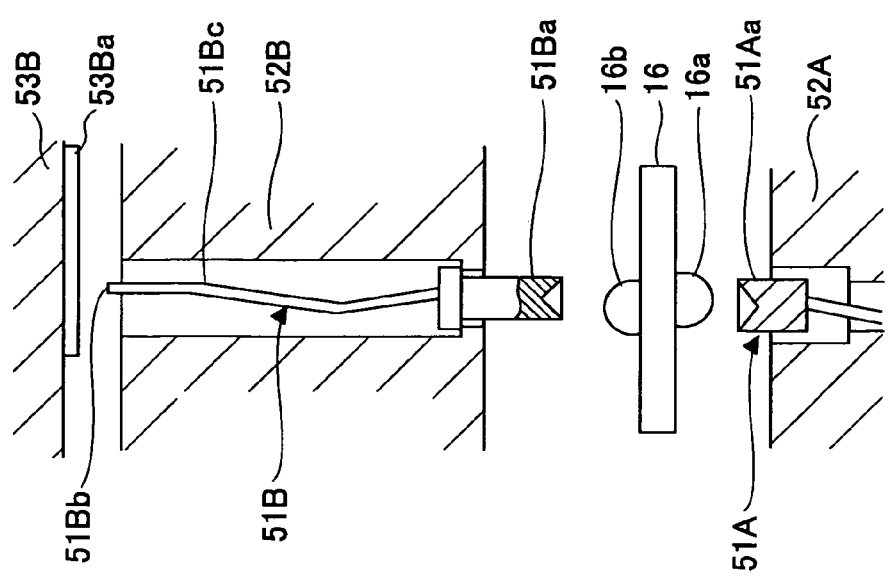
FIG. 22 is an illustration showing a position of a contact piece relative to an electrode terminal when a contact operation is started.

A description will be given, with reference to FIG. 22 and FIG. 23, of the positioning and the contact condition. FIG. 22 shows a contact state before a contact operation of the contact pieces 51A and 51B is started with respect to the electrode terminals 16a and 16b provided on both surfaces of the IC 16 to be tested.

In the IC 16 to be tested, there may be a case where the electrode terminals 16a provided on one of the main surfaces and the electrode terminals 16b provided on the other of the main surfaces, of which center axes are to be aligned with each other, are formed with a slight offset or displacement to each other in the manufacturing process. In the state shown in FIG. 22, the electrode terminal 16a provided on one of the main surfaces (bottom surface) is offset to the right side and the electrode terminal 16b provided on the other of the main surfaces (top surface) is offset to the left side. Accordingly, in a state before the contact operation is started, the electrode terminal 16a is offset to the right side with respect to the electrode 51Aa of the contact piece 51A in the lower-side contactor, and the electrode terminal 16b is offset to the left side with respect to the electrode 51Ba of the contact piece 51B in the lower-side contactor.

By moving the upper-side contactor 51B downward after the IC 16 having the above-mentioned electrode terminal structure is accommodated in the lower-side contactor 51A through the opening of the cover 54, a downward pressing force is applied to the IC 16 through the contact pin 51B and the contract portion 51ba.

According to the pressure due to the downward movement of the upper-side contactor, a component force, which causes the contact portion 51Aa to the right side, is generated between the lower electrode terminal 16a and the corresponding contact portion 51Aa. On the other hand, a component force, which causes the contact portion 51Ba to the right side, is generated between the upper electrode terminal 16b and the corresponding contact portion 51Ba. The two component forces are generated simultaneously.

According to the component forces, two contact portions 51Aa and 51Ba move in transverse directions, and, as a result, the electrode terminals 16a and 16b of the IC 16 are received by the conically recessed portions of the respective contact portions 51Aa and 51Ba of the contact pieces 51A and 51B. Such a contact state is shown in FIG. 23.

That is, according to the present embodiment, even in a case where there is a slight offset in relative positions of electrode terminals on both front and back surfaces of an IC to be tested, the contact pieces of the contactor making a contact with the electrode terminals can move to change their positions in accordance with the electrode terminals. Thereby, an appropriate contact state can be achieved efficiently with respect to the electrode terminals on both surfaces.

That is, each of the electrode terminals, which is received by the conically recessed portion in a state where the center axis thereof is aligned with the center axis of the conically recessed portion by self-centering, is brought into contact with the conically recessed portion of the corresponding contact piece in a continuous generally ring-like area of the surface of the conically recessed portion. Accordingly, there is no point contact occurs between the electrode terminals and the contact pieces, which achieves a lower resistance contact.

It should be noted that although the contact pieces 51A are supported by the springs 61 and are separated from the substrate in the initial stage, that is, before the contact is made, with respect to the lower-side contactor 50A in the above-mentioned embodiment, the base 51A may be fixed so that only the upper-side contactor 50B is movable in a vertical direction. In such a case, the first contact portion 51Aa of the contact piece 51A is movable in a transverse direction with the second contact portion 51Ab serving as a supporting point.

Additionally, although the contact pieces are made movable in a transverse direction in each of the lower-side contactor 50A and the upper-side contactor 50B in the aforementioned embodiment, the movement of the contact pieces in a transverse direction may be permitted in one of the lower-side contactor 50A and the upper-side contactor 50B.

If, for example, a number of upper electrode terminals 16b of the IC 16 is small or an interval between electrode terminals 16B is large, a conventional contact mechanism may be used in the upper-side contactor without using the structure in which the end portions of the contact pieces 51B are movable in a transverse direction.

It should be noted that the configuration to achieve the centering function such as the configuration shown in FIGS. 17A through 19B may be appropriately selected for the first contact portion 51Aa of the contact piece 51A and the third contact portion 51Ba of the contact piece 51B in the above-mentioned embodiment.

As mentioned above, according to the present embodiment, even if there is misalignment in the electrode terminals formed on both the upper and lower surfaces, an automatic centering can be carried out with respect to both the upper and lower surfaces by moving the contact pieces in horizontal directions by only pressing the contact pieces against the electrode terminals.

It should be noted that although the description was given of the case where the electrode terminals are formed on both sides of the IC, the present invention is not limited to such a structure. That is, the present invention is applicable also to a case where the electrode terminals are formed on more than three surfaces of an IC. In such a case, three contactors can carry out centering and are brought into contact with the electrode terminals formed on each of the surfaces of the IC.

Figure 24:
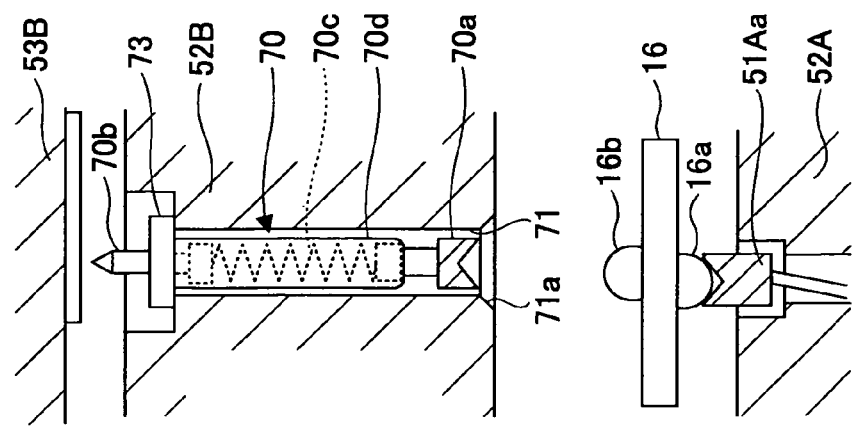
FIG. 24 is a cross-sectional view of an example in which contact pieces of an upper-side contactor are replaced by probe pin type contact pieces.

A description will now be given, with reference to FIGS. 24 and 25, of another example of the upper-side contactor 50B in the above-mentioned embodiment. FIG. 24 shows an example in which the contact piece 51B of the upper-side contactor 50B is replaced by a so-called probe pin type contact piece 70.

In the contact piece 70, a coil spring 70c is provided between a first contact portion 70a (corresponding to the third contact portion 51Ba in FIG. 20) and a second contact piece 70b (corresponding to the fourth contact portion 51Ba in FIG. 20) so that the first contact portion 70a and the second contact portion 70b are movable in a vertical direction (longitudinal direction) due to expansion and contraction of the coil spring 70c.

The coil spring 70c is accommodated in a spring accommodation portion 70d, which is accommodated in a through hole 70b formed in the base 52B. The second contact portion 70b is provided with a collar portion 73 having an outer diameter larger than an outer diameter of the spring accommodation portion 70d so that the contract piece 70 is held in the through hole 71 by being supported by the collar portion 73.

The through hole 71 has an inner diameter larger than the outer diameter of the spring accommodation portion 70d, and, thus, the contact piece 70 is movable in a transverse direction in the through hole 71. Thereby, positioning and reception of the electrode terminal 16b of the IC 16 to be tested can be easily performed.

It should be noted that the reception of the electrode terminal 16b can be more easily achieved by providing a slanting surface 71a on a lower end portion (a portion where the contact portion 70a is located) of the through hole 71.

FIG. 25 shows a contact state where the base 52B is moved downward and the first contact portion 70a is brought into contact with the upper electrode terminal 16B of the IC 16. When the base 52B moves further downward from the state shown in FIG. 25, the conically recessed portion of the first contract portion 70a moves in a transverse direction (in the leftward direction in the figure), and, then, the electrode terminal 16b is received by the first contact portion 70a as shown in FIG. 26.

When the substrate 53B is further pressed downward from the state shown in FIG. 26, the terminal 53Ba of the substrate 53B is brought into contact with the second contact portion 70b of the contact piece 70, and the contact is completed.

A description will now be given, with reference to FIG. 28 and FIG. 29, of a case where the probe pin type contact piece is applied to the lower-side contactor 50A.

In FIG. 28, the probe pin type contact piece 80 provided in the lower-side base 82 comprises a first contact portion 80a, a second contact portion 80b and a spring accommodation portion 80c extending between the first contact portion 80a and the second contact portion 80b. A coil spring is accommodated in the spring accommodation portion 80c.

The first contact portion 80a comprises a neck portion 80d between the first contact portion 80a and the spring accommodation portion 80c. The neck portion 80d has an outer diameter smaller than that of the first contact portion 80a and the spring accommodation portion 80c. The neck portion 80d is accommodated in a neck hole 82a of the base 82. An inner diameter of the neck hole 82a is smaller than the outer diameter of the first contact portion 80a, but is sufficiently larger than the outer diameter of the neck portion 80s. Additionally, the spring accommodation portion 80d of the contact piece 80 is accommodated in a through hole 82b. An inner diameter of the through hole 82b is sufficiently larger than the outer diameter of the spring accommodation portion 80d.

According to the above-mentioned dimensional relationship between the portions, the contact piece 80 is permitted to move in a transverse (horizontal) direction.

FIG. 29 shows a structure that permits a substantial movement of a contact position by causing the first contact portion 80a movable along an arc-like path in the probe pin type contact piece 80 provided in the lower-side base 82. That is, the inner diameter of the neck portion 82a accommodated in the neck portion 80d of the contact piece 80 is set so that the neck portion 80d can move vertically up and down.

On the other hand, the inner diameter of the through hole 82b accommodated in the spring accommodation portion 80d is varied in a plurality of steps or continuously so that the inner diameter close to the substrate 13 is larger than the inner diameter close to the neck portion 80d. According to the above-mentioned structure, in the contact piece 80c, the first contact portion 80a is permitted to perform a rotational movement or a circular movement with the neck portion 80d serving as a supporting point. Thus, similar to the transverse movement in the example shown in FIG. 28, the electrode terminal 15a of the IC 15 can be received by the conically recessed portion.

The transverse movement shown in FIG. 28, the rotational or circular movement shown in FIG. 29 and a combination may be selected appropriately according to a number of electrode terminals to be contacted, a structure of the contactor or the like.

Additionally, in the embodiment of the present invention, the lower-side base is movably supported on the substrate in upward and downward directions by shafts and springs, and the contact pieces of the contactor located on the base are made movable in a transverse direction.

Figure 30:
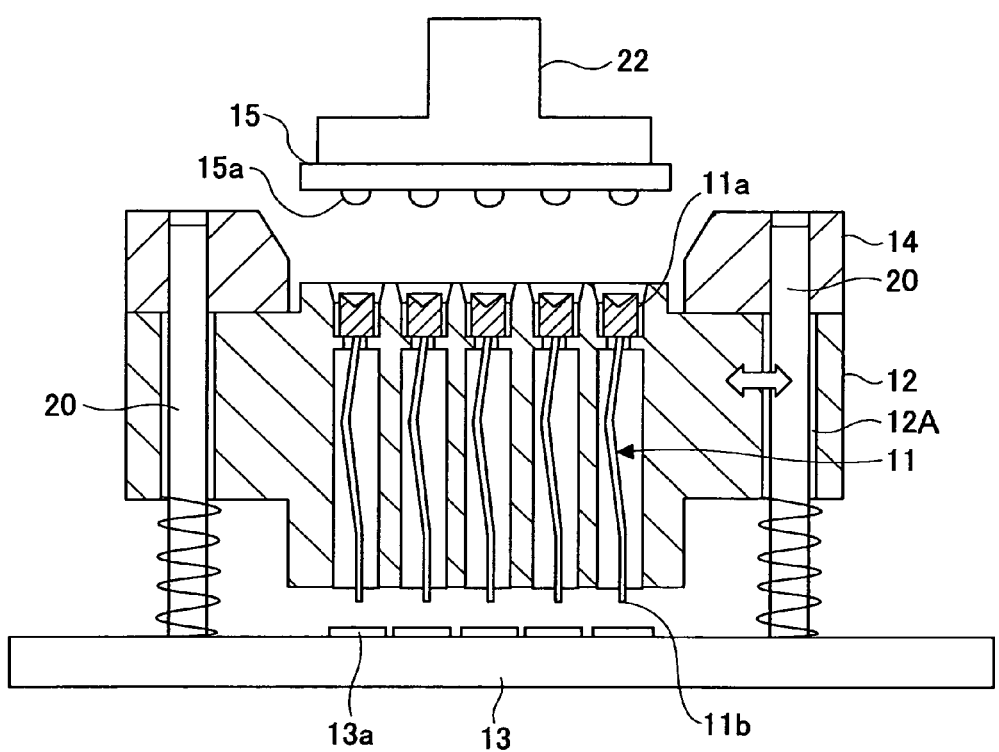
FIG. 30 is an illustration of an example in which an inner diameter of a through hole into which a shaft of a lower base is inserted is enlarged.

The present invention is not limited to such a structure, and, by making the inner diameter of the through hole 12A, into which the shaft 20 is inserted in the lower-side base 12, larger as shown in FIG. 30, a space in a direction substantially perpendicular to an extending direction of the shaft 20 can be larger, thereby enabling a movement of the lower-side base 12 itself in a transverse direction when accommodating and pressing an IC to be tested. According to such a structure, the reception of the electrode terminals in the conically recessed portion of the contact portion can be easier even if there is a large offset or displacement in the arrangement of the electrode terminals.

That is, the IC 15 supported by an IC support and press part 22 is inserted into an opening provided in the cover 14, and when the electrode terminals 15a of the IC 15 are brought into contact with the rim of the opening of the upper surface of the base 12, the cover 14 is moved in a transverse direction due to a transverse component force generated by the downward movement of the electrode terminal 15a. If the IC 15 further moves downward and the electrode terminals 15a are brought into contact with the first contact portions 11a, the first contact portions 15a move in a transverse direction, if it is needed, so that the electrode terminals 15a are received in the respective conically recessed portions.

According to the above-mentioned two-step operation, the electrode terminals 15a of the IC 15 are more rapidly received in the conically recessed portions of the first contact portions 11a.

Similarly, the upper-side base itself can be made movable in a transverse direction, when accommodating and pressing an IC to be tested, by providing a larger space in a direction substantially perpendicular to the extending direction of the shafts. According to such a structure, when the electrode terminals 16b are brought into contact with the slanting surfaces 71a formed in the base 52B in the structure shown in FIG. 25 through FIG. 27, the base 52B itself moves in a transverse direction, and, thereby, the electrode terminals 16b can be easily received by the recessed portions of the first contact portions 70a.

A description will now be given, with reference to FIG. 31 through FIG. 40, of a fifth embodiment of the present invention. In the fifth embodiment, parts that are the same as the parts explained in the first embodiment are given the same reference numerals, and descriptions thereof will be omitted.

Figure 31:
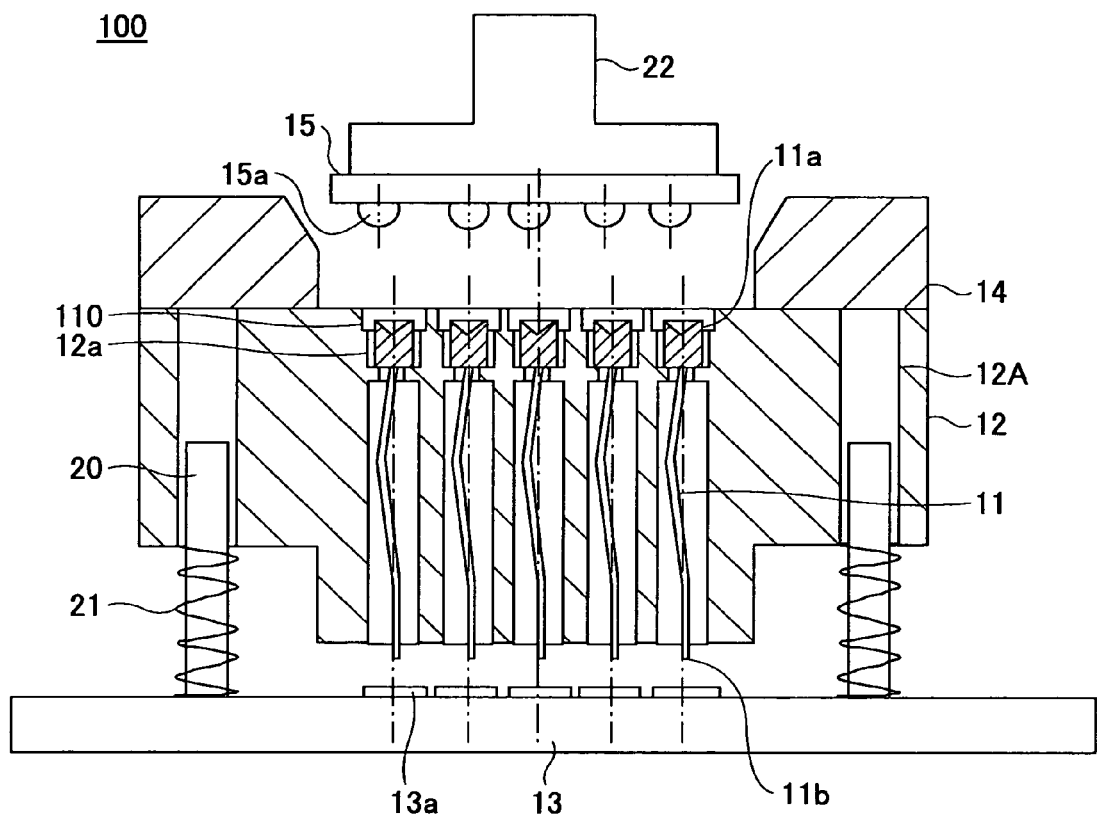
FIG. 31 is a cross-sectional view of a contactor according to a fifth embodiment of the present invention in a state before an IC is attached thereto.
Figure 32:
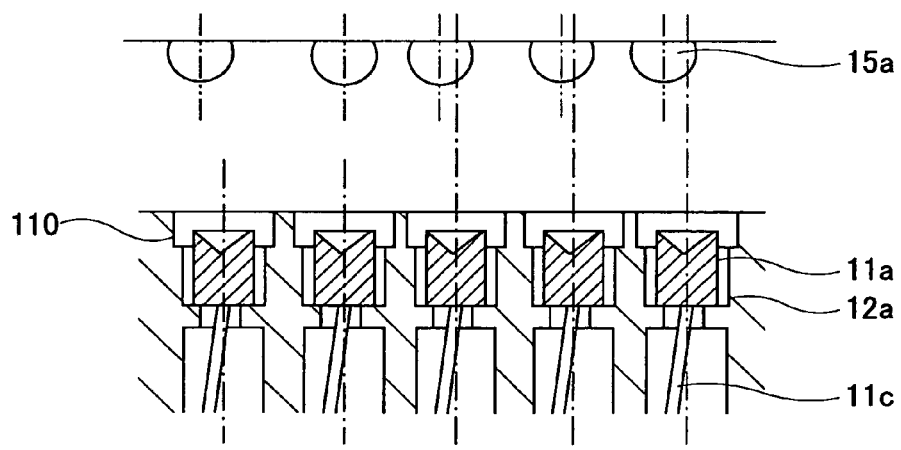
FIG. 32 is a view for explaining a positional relationship between electrode terminals of the IC, electrode terminal guiding holes ad first contact portions shown in FIG. 31.
Figure 33:
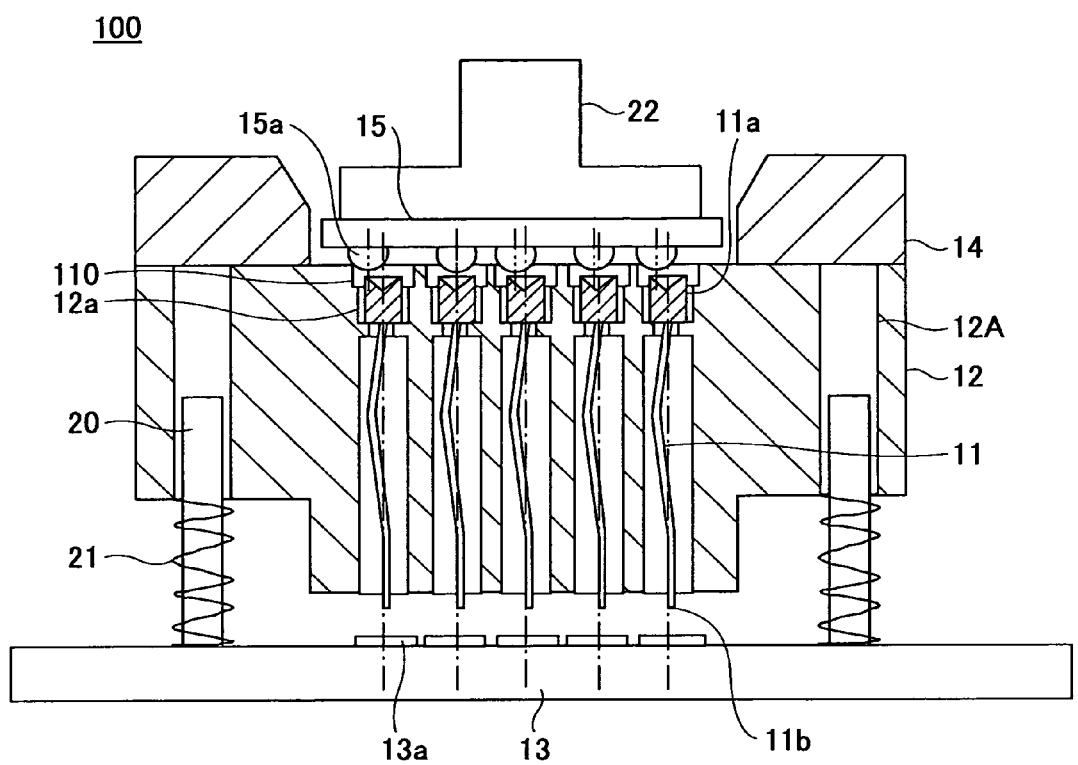
FIG. 33 is a cross-sectional view of the contactor in a state where the electrode terminals of the IC are in contact with inner surfaces of the electrode terminal guiding holes.

FIG. 31 shows a cross-sectional view of a contactor 100 according to the fifth embodiment of the present invention. More specifically, FIG. 31 shows the contactor 100 in a state where the IC 15 is accommodated. FIG. 32 is an enlarged view of the electrode terminals 15a of the IC 15 and electrode terminal guiding holes 110 and the first contact portions 11a of the contact pieces 11 showing a positional relationship therebetween.

In the above-mentioned first embodiment, the contact portion holes 12a, each of which has an inner diameter larger than the outer diameter of the first contact portion 11a of the contact piece 11 so as to accommodate the first contact portion 11a, are formed in the upper portion of the base 12. On the other hand, in the present embodiment, the electrode terminal guiding holes 110 are formed in the base 12 on the upper side of the contact portion holes 12a, that is, on the side where the electrode terminals 15a are inserted. The contact portion holes 12a and the electrode terminal guiding holes 110 are connected with each other. Additionally, an inner diameter of each electrode terminal guiding hole 110 is set larger than the inner diameter of each contact portion hole 12a, and the inner diameter of each electrode terminal guiding hole 110 is uniform at any position along a direction of depth (vertical direction in FIG. 32).

In the state shown in FIG. 31 and FIG. 32, the center axes (indicated by double-dashed chain lines in the figures) of the plurality of electrode terminals 15a of the IC 15 and the center axes (indicated by single-dashed chain lines in the figures) of the respective first contact portions 11a of the contact pieces 11 are not aligned with each other with respect to all of the electrode terminals 15a. That is, misalignment occurs in a part of the electrode terminals 15a and the corresponding first contact portions 11a. Specifically, in FIG. 32, misalignment occurs between the center axes of the electrode terminals 15a and the center axes of the corresponding first contact portions 11a except for the electrode terminal 15a at a second place from the left hand side.

In the above-mentioned state, the IC 15 held by the IC holding and pressing part 22 and the contactor 100 are located opposite to each other with a predetermined distance therebetween. The base 12 of the contactor 100 is movable in a transverse direction in the figure.

By moving downward the IC holding and pressing part 22, which holds the IC 15, when the electrode terminals 15a of the IC 15 are brought into contact with the electrode terminal guiding holes 110, the base 12 in which the electrode terminal guiding holes 110 are formed is moved to follow the positions of the electrode terminals 15a, and, thereby, the electrode terminals 15a are received in the electrode terminal guiding holes 110. Then, when the electrode terminals 15a contact with the first contact portions 11a, similar to the first embodiment, the alignment between the first contract portions 11a and the electrode terminals 15a, that is, the centering is achieved according to self-alignment by the movement of the first contact portions 11a.

In the base 120, a space or gap in a direction substantially perpendicular to the extending direction of the shaft 20 is enlarged by making larger the inner diameter of the through hole 12A, into which the shaft 20 is inserted, similar to the above-mentioned fourth embodiment, thereby enabling the movement of the base 120 itself in the transverse direction when accommodating and pressing the IC 15.

According to the above-mentioned configuration and arrangement, the reception of the electrode terminals by the conical recessed portions of the contact portions is made easier even if there is large displacement or variation in the arrangement of the electrode terminals.

When the IC holding and pressing part 22 is moved further downward from the state shown in FIG. 31 and FIG. 32, the electrode terminals 15a of the IC 15 are brought into contact with the inner surfaces of the electrode terminal guiding holes 110. In this state, the misalignment between the plurality of electrode terminals 15a of the IC 15 and the corresponding first contact portions 11a of the contact pieces 11 is not eliminated yet. It should be noted that FIG. 34 is an enlarged view showing a positional relationship between the electrode terminals 15a of the IC 15 and the electrode terminal guiding holes 110 and the first contact portions 11a of the contact pieces 11 in the contactor 100 shown in FIG. 33.

Figure 34:
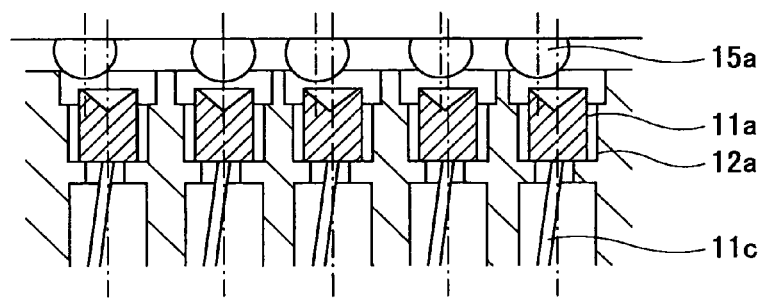
FIG. 34 is a view for explaining a positional relationship between the electrode terminals of the IC and the electrode terminal guiding holes shown in FIG. 33.
Figure 35:
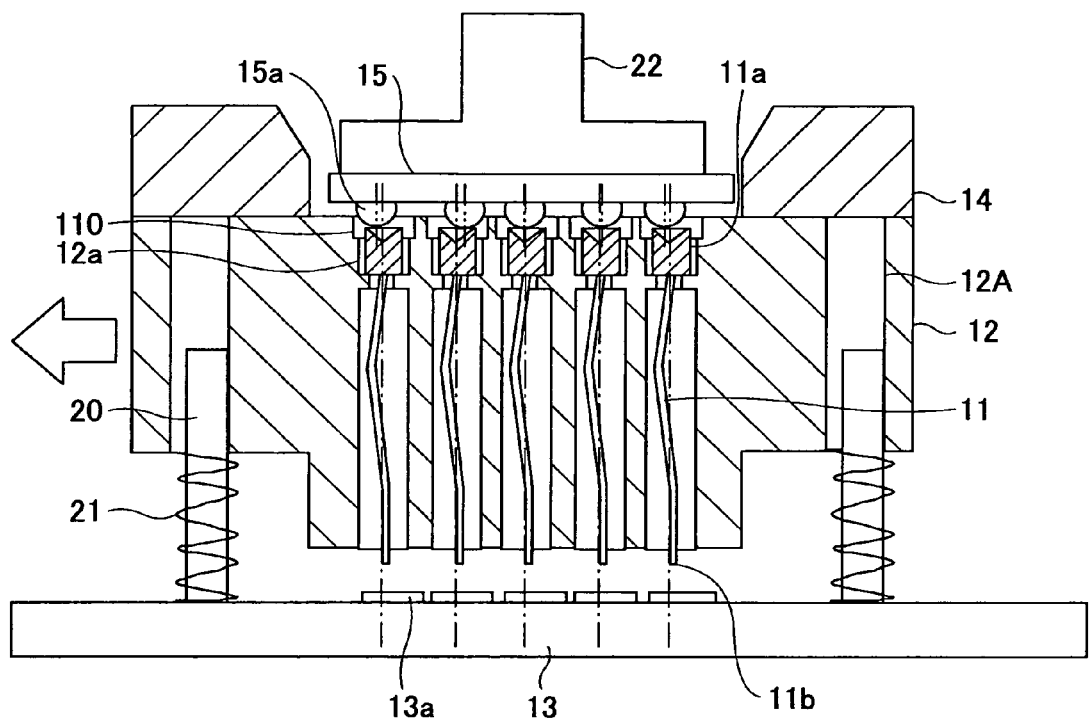
FIG. 35 is a cross-sectional view of the contactor in a state where the electrode terminals of the IC are accommodated in the electrode terminal guiding holes.

When the IC holding and pressing part 22 is moved further downward from the state shown in FIG. 34 and FIG. 35, the base 12, in which the electrode terminal guiding holes 110 are formed, is moved in a direction substantially perpendicular to a direction in which the IC 15 is pressed to follow the positions of the electrode terminals 15a, that is, in the transverse direction in the state shown in FIG. 35. It should be noted that FIG. 36 is an enlarged view showing a positional relationship between the electrode terminals 15a of the IC 15 and the electrode terminal guiding holes 110 and the first contact portions 11a of the contact pieces 11 in the contactor 100 shown in FIG. 35.

That is, the inner surfaces of the electrode terminal guiding holes 110 with which the electrode terminals 15a are contacted are pressed in the transverse direction due to a transverse component force of the pressing force of the electrode terminals applied to the electrode terminal guiding holes 110. Consequently, the base 12 is moved in the transverse direction, and the electrode terminals 15a are accommodated in the electrode terminal guiding holes 110.

Consequently, even if there is a variation in the positions of the plurality of electrode terminals 15a formed in the IC 15, the first contact portions 11a of the contact pieces 11 can be located at positions under the respective electrode terminals 15a at which the self-alignment of the first contact portions 11a can be carried out. That is, by moving the electrode terminal guiding holes 110 of the base 120 of the contactor 100 in the transverse direction in accordance with the positions of the electrode terminals 15a of the IC 15, a state where the first contact portions of the contact pieces 11 and the electrode terminals 15a are accurately aligned with each other can be set.

Figure 36:
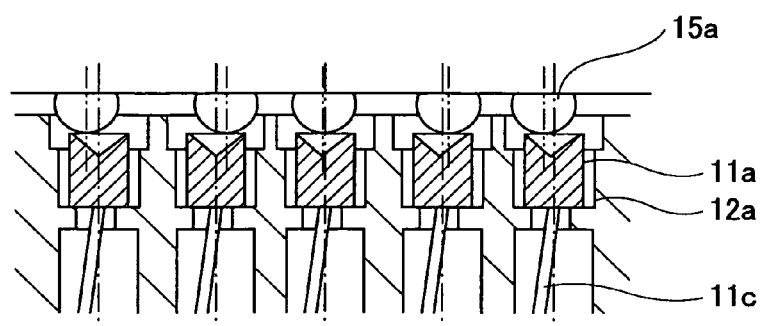
FIG. 36 is a view for explaining a positional relationship between electrode terminals of the IC, electrode terminal guiding holes ad first contact portions shown in FIG. 35.
Figure 37:
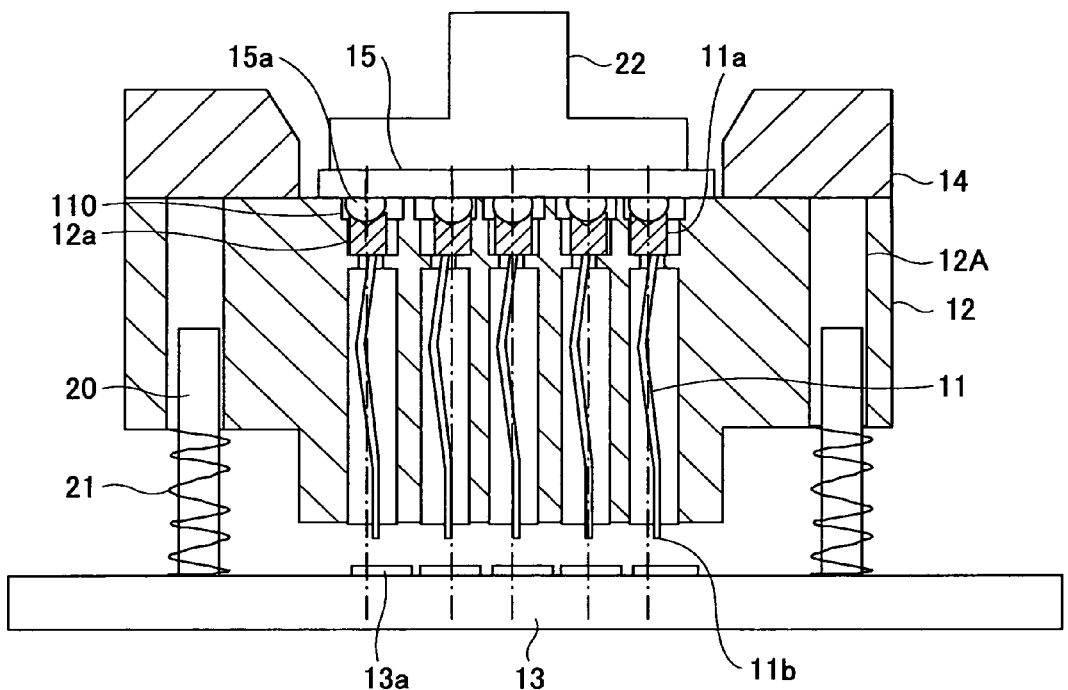
FIG. 37 is a cross-sectional view of the contactor in a state where the electrode terminals of the IC are completely in contact with contact pieces.
Figure 38:
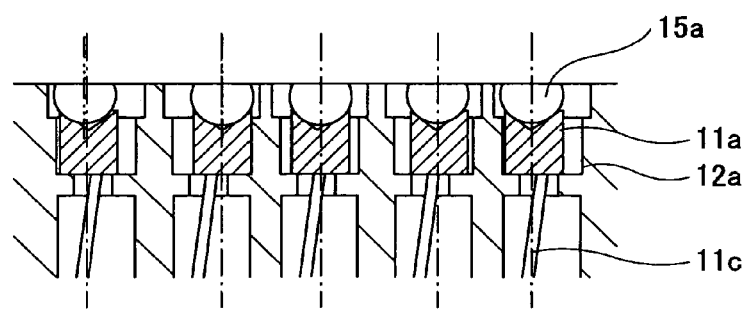
FIG. 38 is a view for explaining a positional relationship between the electrode terminals of the IC and first contact portions of the contact pieces show in FIG. 37.

When the IC holding and pressing part 22 is moved further downward from the state shown in FIG. 35 and FIG. 36, the plurality of electrode terminals 15a are received in the respective conical recessed portions of the first contact portions 11a as shown in FIG. 37 and FIG. 38. That is, the first contact portions are moved in a direction substantially perpendicular to the direction of pressing the IC 15 within the contact portion holes 12a of the base 12. According to the movement, the misalignment in each of the electrode terminals 15a is absorbed, and the plurality of electrode terminals 15a are received in the respective conical recessed portion of the first contact portions 11a. It should be noted that FIG. 38 is an enlarged view showing a positional relationship between the electrode terminals 15a of the IC 15 and the electrode terminal guiding holes 110 and the first contact portions 11a of the contact pieces 11 in the contactor 100 shown in FIG. 37.

Consequently, the center axes of the electrode terminals 15a of the IC 15 and the center axes of the first contact portions 11a are aligned with each other (centering), and the received electrode terminals 15a are brought into contact with the inner surfaces of the continuous conical recessed portions of the first contact portions 11a in generally ring-like areas on the surfaces thereof. As a result, a state is set where the electrode terminals 15a of the IC 15 and the contact pieces 11 having the first contact portions 11a on the upper portions thereof are accurately aligned with each other.

Figure 39:
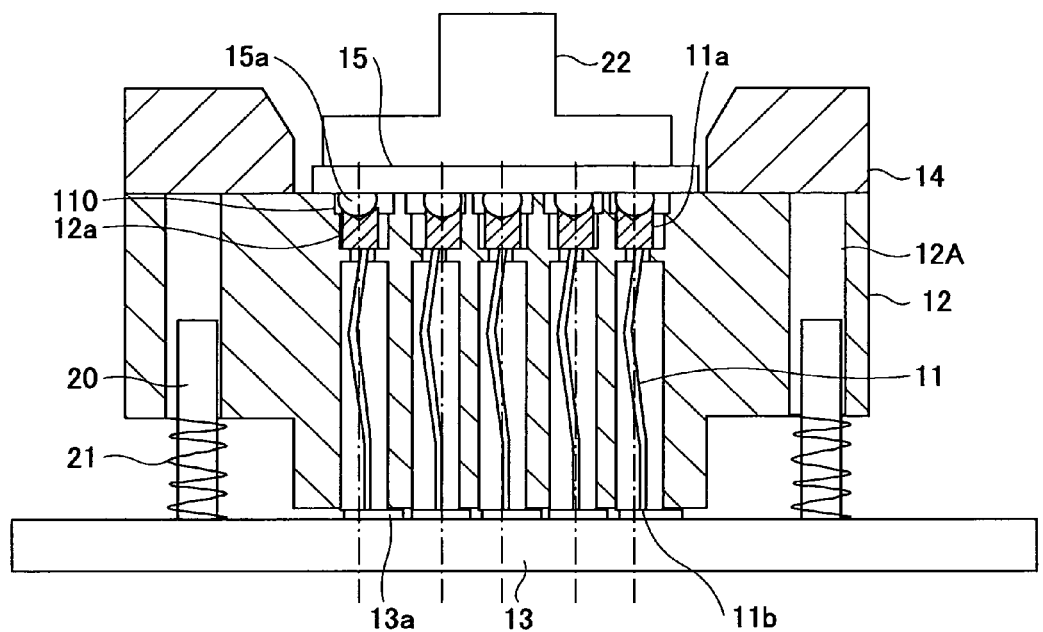
FIG. 39 is a cross-sectional view of the contactor in a state where the IC is completely incorporated.
Figure 40:
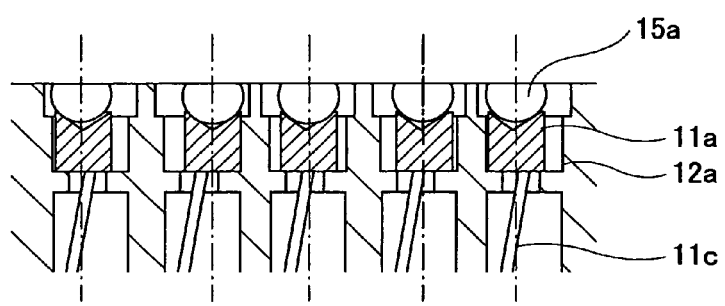
FIG. 40 is a view for explaining a positional relationship between the electrode terminals of the IC and first contact portions shown in FIG. 39.

When the IC 15 is move further downward from the state shown in FIG. 37 and FIG. 38, the springs 21 are compressed due to a pressing force via the IC 15 and the base 12 is moved downward as shown in FIG. 39 and FIG. 40. Then, the second contact portions 11b of the contact pieces 11 are brought into contact with the terminals 13a arranged on the substrate 13, thereby electrically connecting the IC 15 and substrate 13 with each other.

In the state shown in FIG. 39, power and electric signals are supplied to the IC 15 through the substrate 13 so as to perform a final test (electric test) of the IC 15. It should be noted that FIG. 40 is an enlarged view showing a positional relationship between the electrode terminals 15a of the IC 15 and the electrode terminal guiding holes 110 and the first contact portions 11a of the contact pieces 11 in the contactor 100 shown in FIG. 39.

As mentioned above, according to the present embodiment, the IC 15 is not fallen by gravity but moved closer and inserted into the contact portions of the contactor 100 in the state where the IC 15 is held by the IC holding and pressing part 22. Thereby, the position alignment is carried out by moving the electrode terminal guiding holes 110 in accordance with the positions of the electrode terminals 15a formed in the IC 15, which results in the contact between the electrode terminals 15a of the IC 15 and the first contact portions 11a of the contract pieces 11.

Therefore, as compared to the fall by gravity, the waste time of falling period is eliminated, which enables an attempt of improving work efficiency.

Furthermore, according to the present embodiment, the first contact portions 11a of the contact pieces 11 and the electrode terminals 15a in the contactor can be accurately aligned with each other by merely receiving the electrode terminals 15a in the electrode terminal guiding holes 110 even if there is a comparatively large displacement in the positions of the electrode terminals formed in the IC 15 since the electrode terminal guiding holes 110 are formed in the base 12 of the contactor in the upper portions of the contact portion holes 12a, that is, on the side where the electrode terminals 15a are inserted. Thus, a stable contact of both can be achieved.

Each of the electrode terminal guiding holes 110 are formed to have an inner diameter larger than the inner diameter of each of the contact portion holes 12. Accordingly, as compared to the case where the electrode terminal guiding holes 110 are not formed, a correction range for aligning the electrode terminals 15a and the contact pieces 11 with each other is expanded.

In the case where the positions of the electrode terminals 15a and the contact pieces 11 are varied largely, if the electrode terminal guiding holes 110 are not formed, there may occur a state where the electrode terminals 15a are strongly pressed into the first contact portions 11a when the electrode terminals 15a are brought into contact with the first contact portions 11a of the contact pieces 11, which may damage the electrode terminals 15a.

However, in the present embodiment, a large variation in the positions of the electrode terminals 15a is absorbed by the movement of the base 12 when receiving the electrode terminals 15a in the electrode terminal guiding holes 110, which assists the electrode terminals 15a being brought into contact with the first contact portions 11a of the contact pieces 11. Thus, there is no possibility of damaging the electrode terminals.

In the meantime, although the inner diameter of each electrode terminal guiding hole 110 is set larger tan the inner diameter of each contact portion hole 12a, and is set uniform at any position along the depth (vertical direction in FIG. 31) in the present embodiment, the present invention is not limited to such a structure. For example, the electrode terminal guiding hole 110 may have a shape shown in FIG. 41. Here, FIG. 41 is a cross-sectional view of a variation of the electrode terminal guiding hole.

Figure 41:
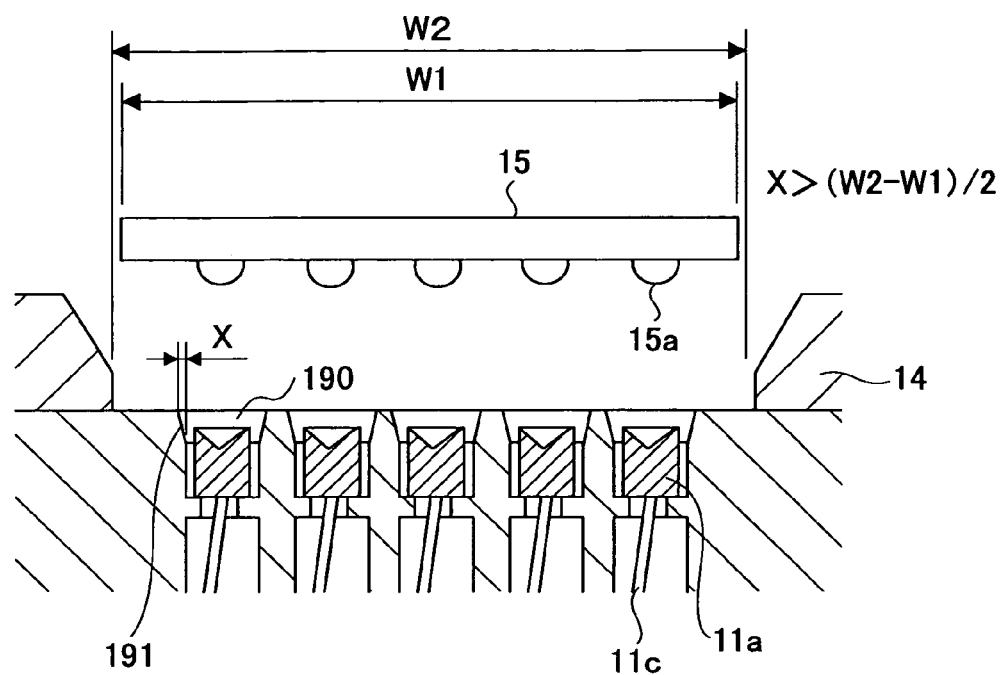
FIG. 41 is a cross-sectional view showing a variation of the electrode terminal guiding hole.

In the example shown in FIG. 41, the electrode terminal guiding hole 190 is formed in a tapered shape, which has a larger diameter on the side where the electrode terminal 15a is inserted (upper side in FIG. 41) and has a smaller diameter on a side where the contact portion hole 120 is connected (lower side in FIG. 41). According to such a configuration, the electrode terminal 15a contacts the electrode terminal guiding hole 190 while sliding a taper portion (slanting portion) 191 thereof, and, thus, the electrode terminal 15a can be received in the electrode terminal guiding hole 190 smoothly and easily without receiving a damage due to catch by the inner surface of the electrode terminal guiding hole 190.

Particularly, if a size W2 of the opening at the cover 14 is larger than the outer size W1 of the IC 15, guidance and alignment by the cover 14 cannot be expected, however, the tapered portion 191 formed in the electrode terminal guiding hole 190 receiving the electrode terminal 15a of the IC 15 makes the reception of the electrode terminal 15 easier. For example, the width X of the tapered portion 191 may be set to a value which is equal to or more than a ½ of a difference between the size W2 of the opening of the cover 14 and the outer size W1 of the IC 15.

A description will now be given, with reference to FIG. 42, of a sixth embodiment of the present invention. Here, FIG. 42 is a cross-sectional view of a contactor according to the sixth embodiment of the present invention.

In the sixth embodiment, a contactor having the same structure as the contactor 100 of the above-mentioned fourth embodiment is brought into contact with electrodes formed on each of a plurality of semiconductor elements (chips) formed on one of main surfaces of a single sheet of semiconductor substrate (wafer) such as a wafer-level CSP (Chip Size Package) or a bump wafer, etc.

Figure 42:
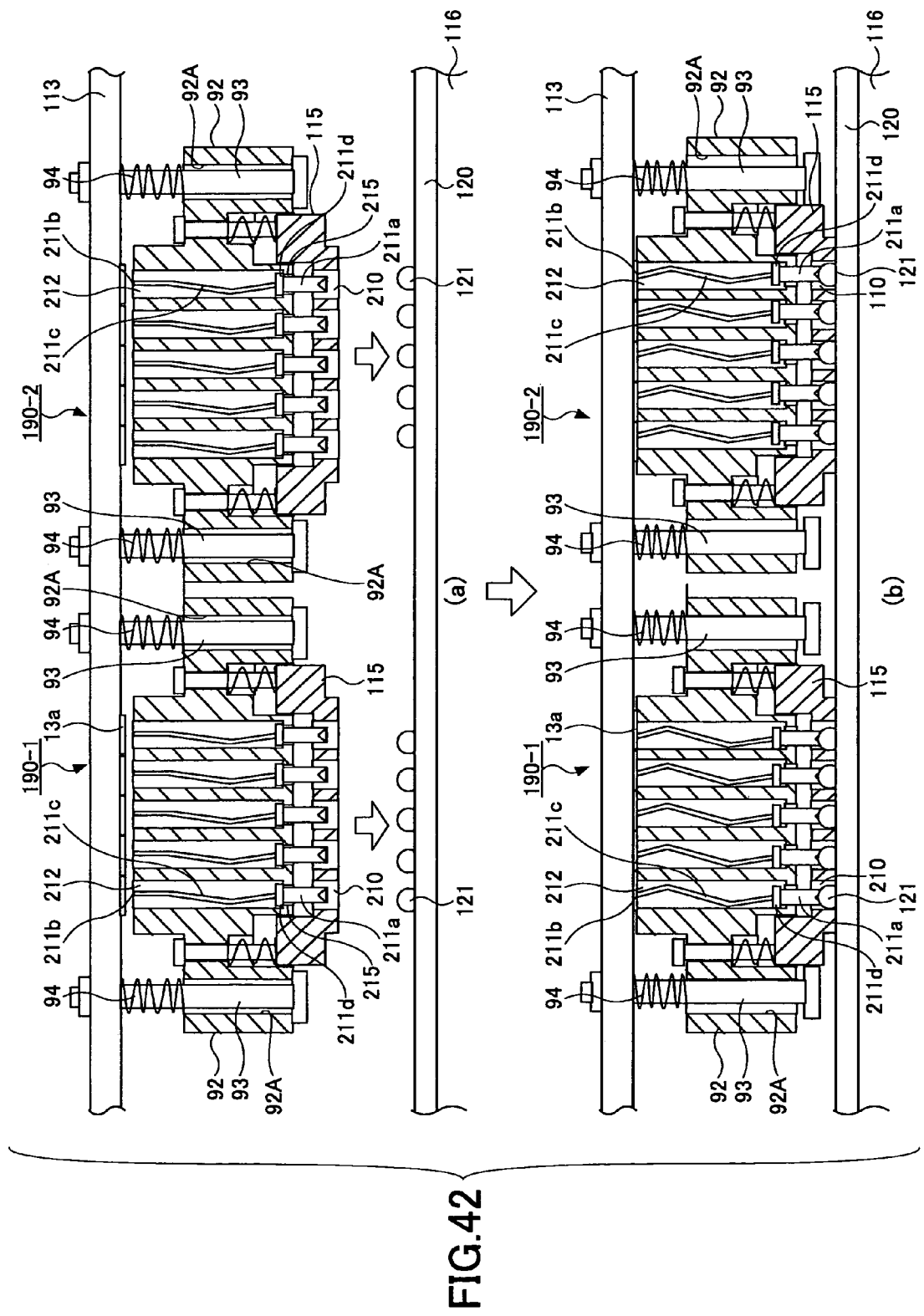
FIG. 42 is a cross-sectional view of a contactor according to a sixth embodiment of the present invention.

With reference to FIG. 42, a semiconductor substrate 120 is placed and fixed on a substrate placement part 116 such as a chuck top or the like in a state where electrode terminals 121 of the semiconductor elements face upward. Additionally, a plurality of contactors 190-1 and 190-2 are retained by a substrate 113 such as a probe card in accordance with the semiconductor elements and arranged at a position above the semiconductor substrate 120.

The contactor 190-1 and the contactor 190-2 have the same structure. In the contactor 190-1 (190-2) concerned, a base 92 is guided by shafts 93 uprightly provided on the substrate 113 and movably supported by springs 94 in vertical directions.

Moreover, each contact pieces 211 consists of a third contact portion 211a of lower side, a collar portion 211d formed on an upper end of the third contact portion 211a, a contact pin 211c formed in an elbow shape and extending upward from the collar portion 211d, and a fourth contact portion 211b which is an upper portion of the contact pin 211.

The collar portion 211d and the contact pin 211c are accommodated in a contact pin hole 212 formed in the base 92. On the other hand, the contact pin hole 212 has an inner diameter larger than an outer diameter of the collar portion 211d, and an inner diameter of a contact portion hole 215 into which the third contact portion 211a is inserted is larger than an outer diameter of the third contact portion 211a. Accordingly, the third contact portion 211a is movable in a transverse direction within the contact portion hole 215.

Additionally, the collar portion 211d of the contact piece 211 is supported at the contact portion hole 215 of the base 92, and the contact piece 211 is held so as to not fall off from the base 92.

Moreover, a plate member 115 is provided under the base 92, that is, on the side of the semiconductor substrate to be processed, and electrode terminal guiding holes 21o are formed in the plate member 115. Lower ends of the third contact portions 211a are located within the electrode terminal guiding holes 210.

The plate member 115 is guided by shafts 95 uprightly extending from the base 92 and movably supported in vertical directions by springs 96. Consequently, the contact portion holes 215 and the electrode terminal guiding holes 210 are communicated with each other via a space between the base 92 and the plate member 115. Additionally, the inner diameter of the electrode terminal guiding hole 21 is set larger than the outer diameter of the third contact portion hole 211a.

In the above-mentioned structure, the plate member 115 alone moves upward and downward, while moving together with the base 92 in a transverse direction.

In this structure, in order to cause the third contact portions 211a of the contact pieces 211 of the contactors 190-1 and 190-2 to contact with the electrode terminals 121 of the wafer 120 so as to electrically connect the electrode terminals 121 with the third contact portions 211a in the contactor, the substrate 113 is caused to move downward first, and, then, the contactors 190-1 and 190-2 are caused to move close to the semiconductor substrate 120 (FIG. 42-(a)).

When the contactors 190-1 and 190-2 are moved further downward so that the electrode terminal guiding holes 210 in the plate members 115 of the contactors 190-1 and 190-2 contact with the electrode terminals 121, the electrode terminal guiding holes 210, that is, the plate members 115 and the base 92 are moved in a transverse direction due to a transverse component force of the pressing force of the electrode terminals 121 applied to the electrode terminal guiding holes 210. Thereby, the electrode terminals 121 are received in the electrode terminal guiding holes 210. As a result, an alignment between the third contact portions 211a and the electrode terminals 121 is carried out through the electrode terminal guiding holes 210.

Here, in the base 92, by enlarging the inner diameter of the through hole into which the shaft 93 the same as the above-mentioned fourth embodiment or the fifth embodiment, a space or gap in a direction substantially perpendicular to an extending direction of the shaft 93 (transverse direction in the figure) is expanded, thereby enabling a movement of the base 92 in the transverse direction when accommodating and pressing the IC 120.

When the contactors 190-1 and 190-2 are moved further downward, the third contact portions 211*a* are moved in the transverse direction in accordance with the positions of the electrode terminals 121, and the electrode terminals 121 are received in the conical recessed portions of the third contact portions 211*a*, thereby contacting the third contact portions 211*a* with the electrode terminals 121 (FIG. 42-(*b*)).

At that time or when the contactors 190-1 and 190-2 are slightly moved further downward, the other ends 211*b* of the contact pins 211 are brought into contact with the electrodes 13*a* arranged on the substrate 113, which results in an electric connection with a test device which is connected through the electrodes 13*a*.

According to the present embodiment, even in a case where an amount of displacement of the electrode terminals of the semiconductor element to be connected to the contactor 190-1 and an amount of displacement of the electrode terminals of the semiconductor element to be connected to the contactor 190-2 are different, the bases of the contactors 190-1 and 190-2 moves independently without moving the semiconductor substrate 120 and alignment is carried out while correcting misalignment of the electrode terminals, thereby achieving a desired contact. Therefore, an accurate and stable contact can be performed easily.

A description will now be given, with reference to FIG. 43 through FIG. 48, of a seventh embodiment of the present invention.

The contactor according to the seventh embodiment is to make a contact with electrode terminals provided in an accommodation container (package) of electronic parts such as a POP (Package On Package) or a structure in which the electrode terminals are provided on both sides (upper and lower surfaces) of a mounting substrate.

In electronic parts having electrode terminals on both front and back surfaces thereof, in order to facilitate handling when conducting an electric characteristic test, it is desirable to have the electrode terminals provided on both front and back surfaces arranged in corresponding positions. However, since the electrode terminals on the front and back surfaces are formed in different processes, it is difficult to have the positions of the front and back surfaces correspond to each other with respect to all of electrode terminals formed on the front and back surfaces in different processes.

Therefore, there is a demand for a contactor that can achieve a good contact for electrode terminals formed on both front and back surfaces of an electronic part.

Figure 43:
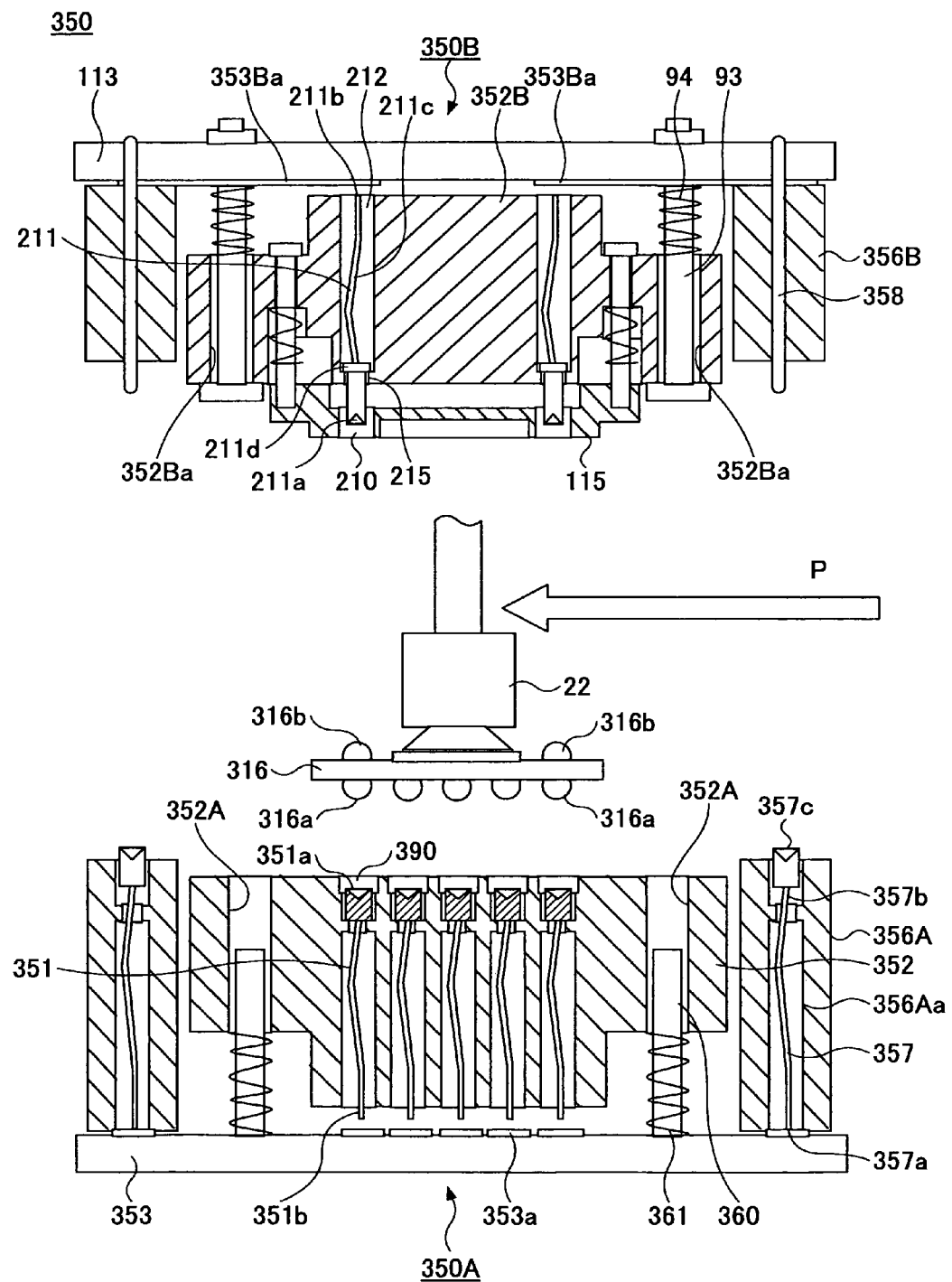
FIG. 43 is a cross-sectional view of a contactor according to a seventh embodiment of the present invention in a state where an IC is loaded.

FIG. 43 shows a state where an IC 316 to be processed is loaded to a contactor 350 according to the present embodiment. In FIG. 43, the IC 316 is loaded to the contactor 350 in a direction indicated by an arrow P (from right to left) by the IC holding and pressing part 22 such as a vacuum chuck or the like. The IC 316 has electrode terminals 316*a* formed on a lower surface thereof and electrode terminals 316*b* formed on an upper surface thereof.

The contactor 350 concerned comprises a lower-side contactor 350A and an upper-side contactor 350B.

The lower-side contactor 350A for making a contact with the electrode terminals 316*a* on the lower surface of the IC 316 comprises, similar to the contactor 100 according to the above-mentioned fifth embodiment, contact pieces 351, a base 352, a substrate 353 and electrode terminal guiding holes 390.

On the other hand, the upper-side contactor 350B for making a contact with the electrode terminals 316*b* on the lower surface of the IC 316 comprises, similar to the contactor 190 according to the above-mentioned sixth embodiment, contact pieces 211, a base 352B, a substrate 113 and electrode terminal guiding holes 210.

In the contactor 350 having the above-mentioned structure, in order to make an electric connection between the electrode terminals 316*b* and the electrode terminals 316*a* of the IC 316 through the substrate 113 of the upper-side contactor 350B and the substrate 353 of the lower-side contactor 350A, a contact mechanism is provided around each of the lower-side contactor 350A and the upper-side contactor 350B.

The contact mechanism of the lower-side contactor 350 comprises, similar to the contact mechanism according to the above-mentioned fourth embodiment, a base 356A of a frame shape provided on the substrate 353 and contact pieces 357 having an elbow shape accommodated in holes 356*a* formed in the base 356. The contact mechanism of the upper-side contactor 350B comprises a base 356B of a frame shape provided on the substrate 113 and probe pins 358 retained by the base 356B.

In the lower-side contactor 350A, electrodes 353*a* extend to positions under one ends (lower ends) of the contact pieces 357, and contact portions having conical recessed portions are provided on the other ends (upper ends) of the contact pieces 357. In the substrate 113 of the upper-side contactor 350B, conductive patterns 353Ba are provided on a surface facing the base 352. Each conductive patterns 353Ba has one end connected to a probe pin 358 and the other end extended to a position above a fourth contact portion of the contact piece 211.

Figure 44:
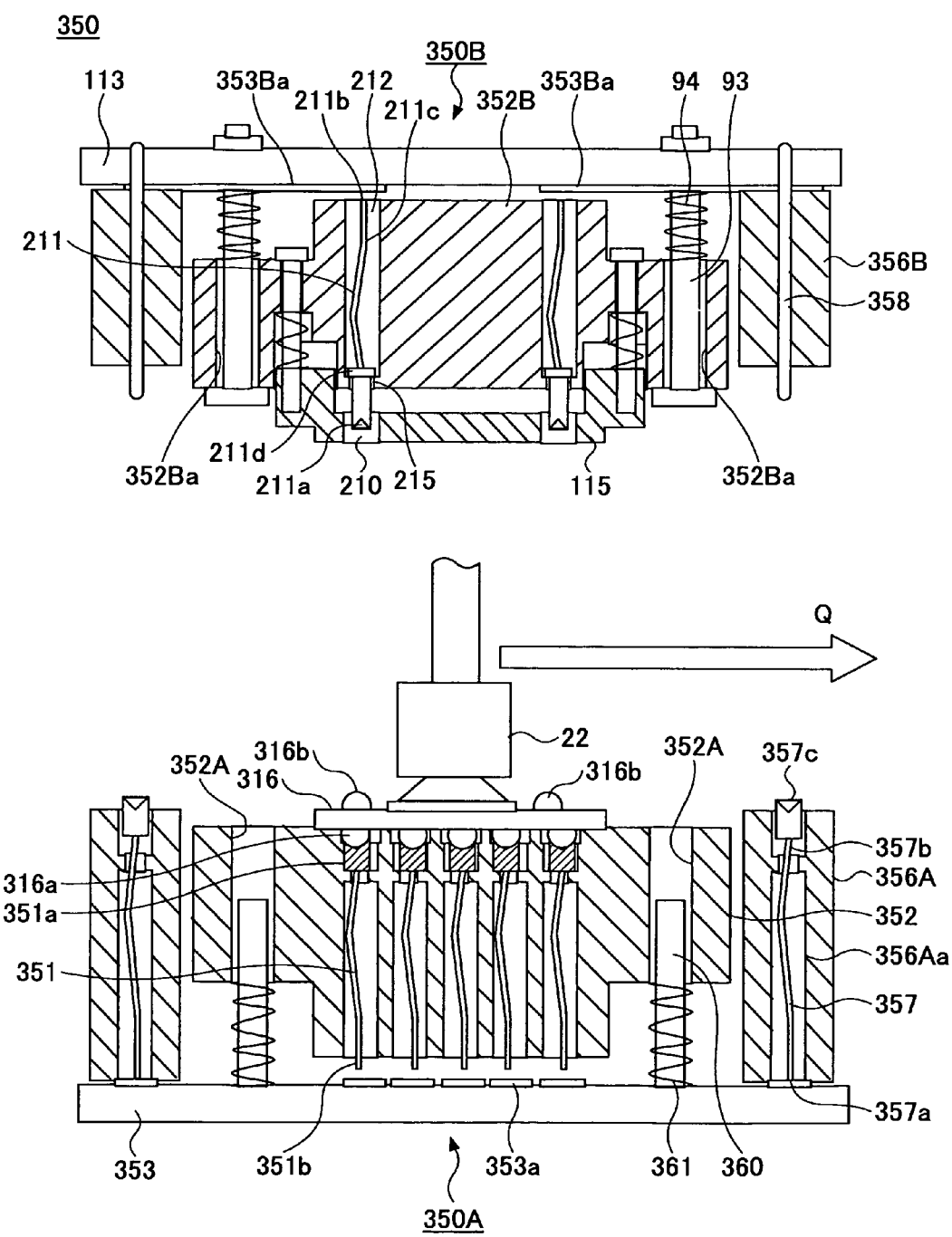
FIG. 44 is a view showing a state where the electrode terminals on the lower surface of the IC are set to a lower-side contactor.

In the state shown in FIG. 43, each of the lower-side contactor 350A and the upper-side contactor 350B is not in a contacted state. When the IC holding ad pressing part 22 is moved further downward from the state shown in FIG. 43, the IC 316 is set to the lower-side contactor 350A as shown in FIG. 44.

Specifically, similar to the above-mentioned fifth embodiment, when the electrode terminals 316*a* of the IC 316 are brought into contact with the electrode terminal guiding holes 390 of the base 352 while the IC 316 is held by the IC holding and pressing part 22, the base having the electrode terminal guiding holes 352 is moved in a transverse direction due to a transverse component force of a pressing force of the electrode terminals 316*a* applied to the electrode terminal guiding holes 390. Consequently, the electrode terminals 316*a* are received in the electrode terminal guiding holes 390, and alignment is carried out between the electrode terminals 316*a* and the first contact portions 351*a* through the electrode terminal guiding holes 390.

Here, in the base 352, similar to the above-mentioned fourth or fifth embodiment, by setting an inner diameter of each through hole 352A into which a shaft 360 is inserted larger, a space or gap in a direction (transverse direction in the figures) substantially perpendicular to an extending direction of the shaft 360 can be expanded, thereby enabling a movement of the base 352 itself in a transverse direction when accommodating and pressing the IC 316.

Subsequently, with the further downward movement of the IC 316, the first contact portions 351*a* of the contact pieces 351 move in a transverse direction in response to the positions of the electrode terminals 316*a* of the IC 316, and the electrode terminals 316*a* are received in the recessed portions of the first contact portions 351*a*, and, thereby, the electrode terminals 316*a* of the IC 316 and the first contact portions 351*a* of the contact pieces 351 contact with each other.

Then, maintenance of IC 316 by IC maintenance pressurization part 22 is solved, it is made to move in the direction shown by Arrow Q in FIG. 44 (from the left to the right), and the IC maintenance pressurization part 22 concerned is removed from the contact part.

Thereafter, the holding of the IC 316 by the IC holding and pressing part 22 is cancelled, and the IC holding and pressing part 22 is moved in a direction indicated by an arrow Q in FIG. 44 (from left to right) so as to be removed from the contact part.

Figure 45:
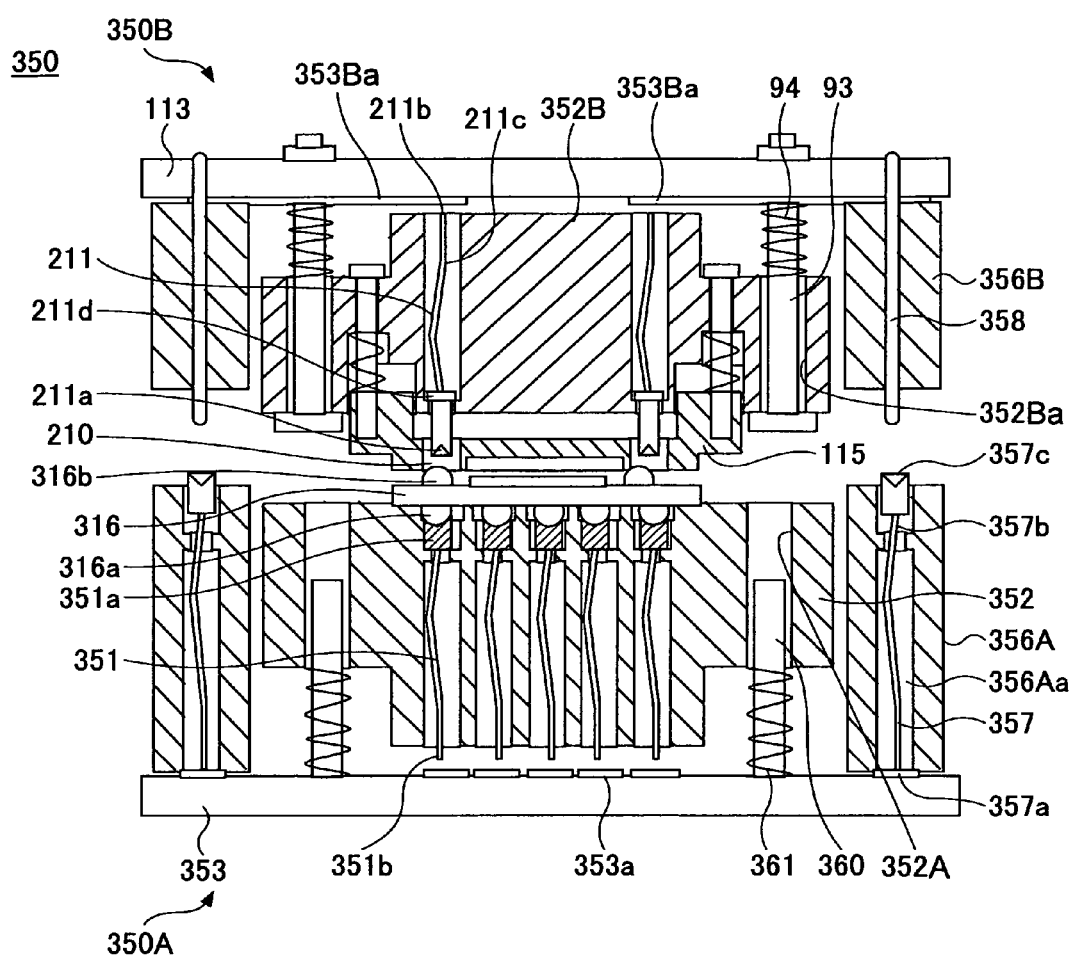
FIG. 45 is a view showing a state where the electrode terminals are in contact with electrode terminal guiding holes formed in an upper-side contactor.
Figure 46:
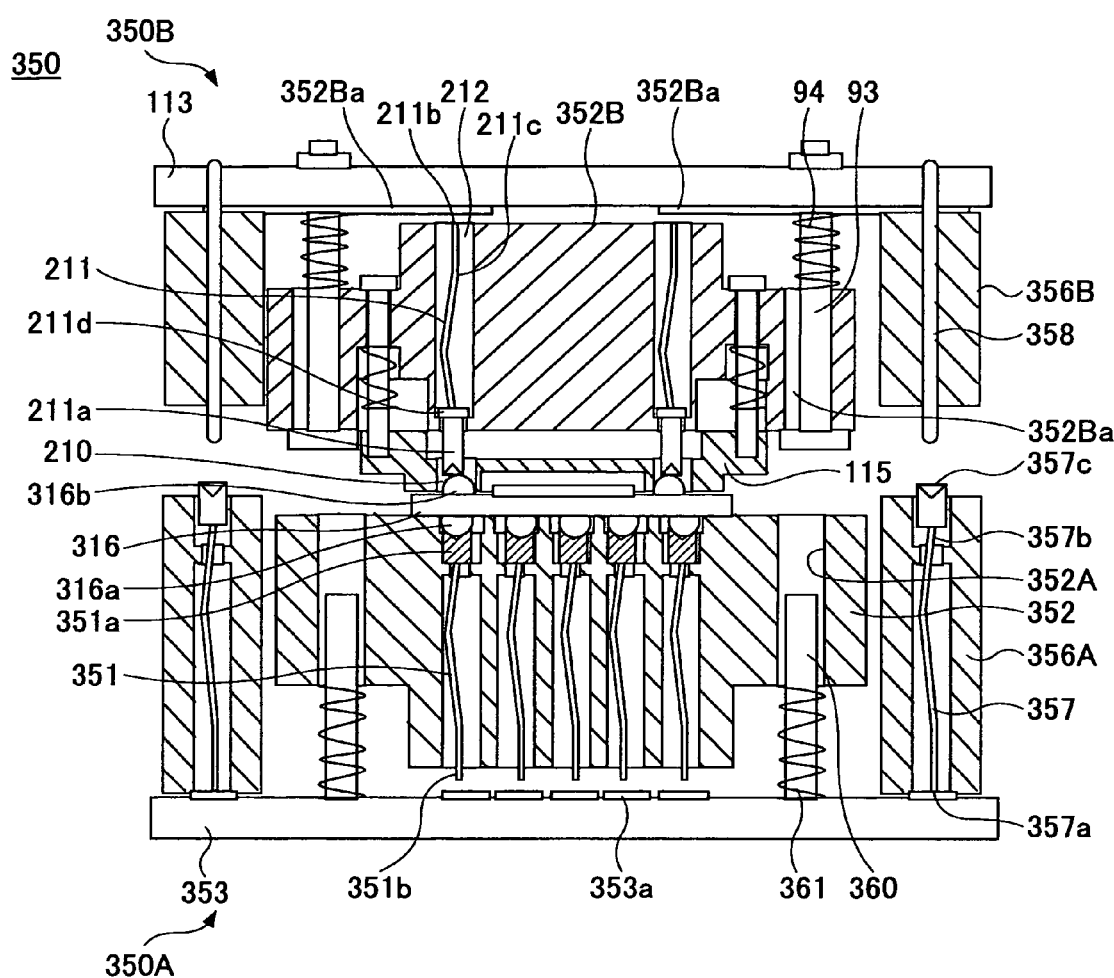
FIG. 46 is a view showing a state where the electrode terminal guiding holes formed in the upper-side contactor move in response to positions of the electrode terminals.

Thereafter, the upper-side contactor 350B is moved downward, as shown in FIG. 45, so as to bring the upper-side contactor 350B close to the electrode terminals 316b formed on the upper surface of the IC 316. With the downward movement of the upper-side contactor 350B, the electrode terminal guiding holes 210 formed in the plate member 115 of the upper-side contactor 350B and the electrode terminals 316b of the IC 316 are brought into contact with each other, and, as shown in FIG. 46, the base 352B in the upper-side contactor 350B moves together with the plate member 115 in a transverse direction in response to the positions of the electrode terminals 316b formed on the upper surface of the IC 316.

Namely, similar to the above-mentioned sixth embodiment, by a transverse component force of the pressing force of the electrode terminals 316b applied to the electrode terminal guiding holes 210, the inner surfaces of the electrode terminal guiding holes 210 to which the electrode terminals 316 contact are pressed in the transverse direction, and, consequently, the plate member 115 and the base 352b move in the transverse direction and the electrode terminals 316b are accommodated in the electrode terminal guiding holes 210.

Here, in the base 352B, similar to the above-mentioned sixth embodiment, by setting the inner diameter of the through hole 352Ba into which the shaft 93 is inserted larger, a space or gap in a direction perpendicular to an extending direction of the shaft 93 (transverse direction in the figures) is expanded, thereby enabling a movement of the base 352B itself in a transverse direction when accommodating and pressing the IC 316.

Consequently, even if there is a variation in the positions of electrode terminals 316b formed in the IC 316, the third contact portions 211a of the contact pieces 211 can be moved to positions above the electrode terminals 316b at which self-alignment can be carried out.

When the upper-side contactor 350B is moved further downward from the state shown in FIG. 46, the electrode terminals 316b are received in the conical recessed portions of the third contact portions 211a of the contact pieces 211. That is, the third contact portions 211a move in a direction (left-right direction) substantially perpendicular to the direction in which the IC 316 is pressed in the contact portions holes 215 of the base 352B. The movement of the third contact portions 211a absorbs a variation in each position of the electrode terminals 316b, and the electrode terminals 316b are received in the conical recessed portions of the third contract portions 211a.

Then, the center axes of the electrode terminals 316b of the IC 316 and the center axes of the third contact portions 211a are aligned with each other (centering), and the received electrode terminals 316b are brought into contact with the inner surfaces of the conical recessed portions of the third contact portions 211a in continuous generally ring-like areas on the surfaces thereof.

Consequently, the positions of the electrode terminals 316b formed in the upper surface of the IC 316 and the positions of the contact pieces 211 provided in the upper-side contactor 350B are accurately aligned with each other, and also the positions of the electrode terminals 316a formed on the lower surface of the IC 316 and the positions of the contact pieces 351 provided n the lower-side contactor 350A are accurately aligned with each other.

Figure 47:
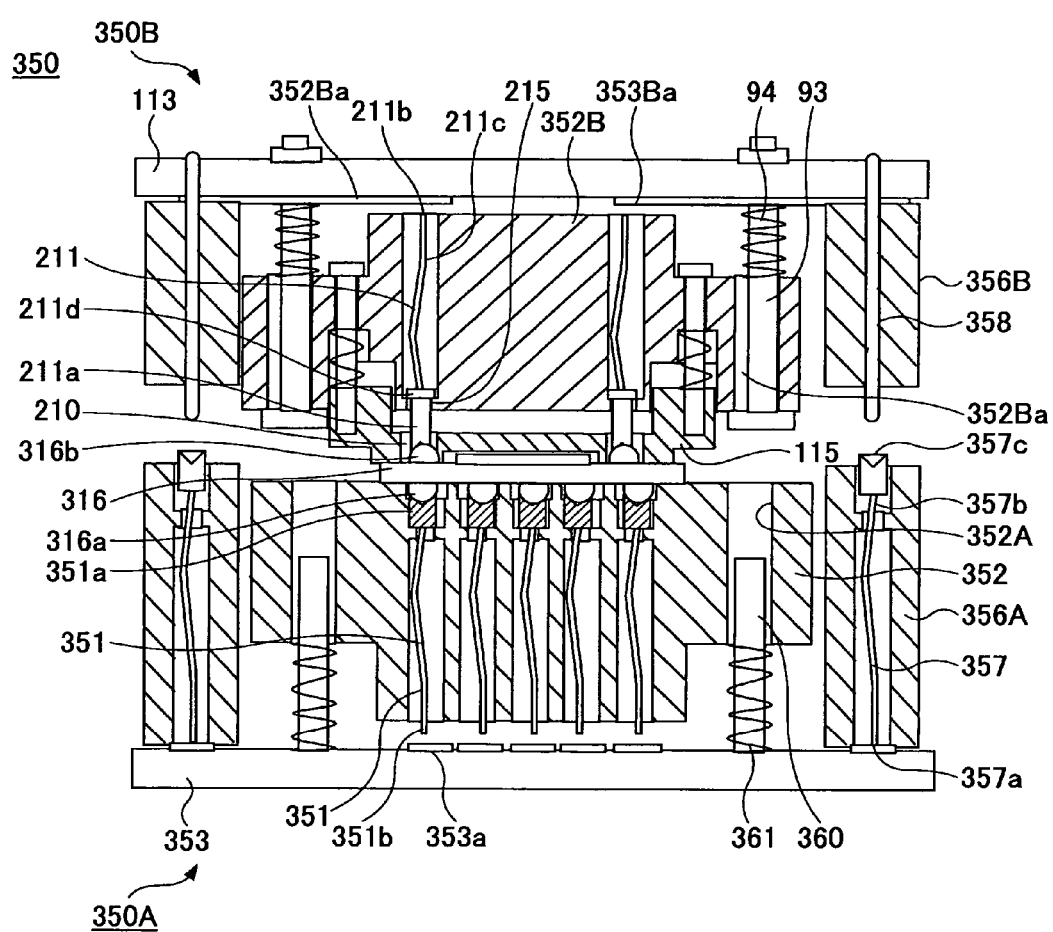
FIG. 47 is a view showing a state where positions of the electrode terminals and the positions of the contact pieces provided in the upper-side and lower-side contactors are aligned with each other.

When the upper-side contactor 350B is moved further downward from the state shown in FIG. 47, the ends 211b of the contact pieces 211 contact with the electrode wirings 353Ba and the springs 94 are compressed and the substrate 113, the base 352B and the probe pins 358 are moved downward.

Figure 48:
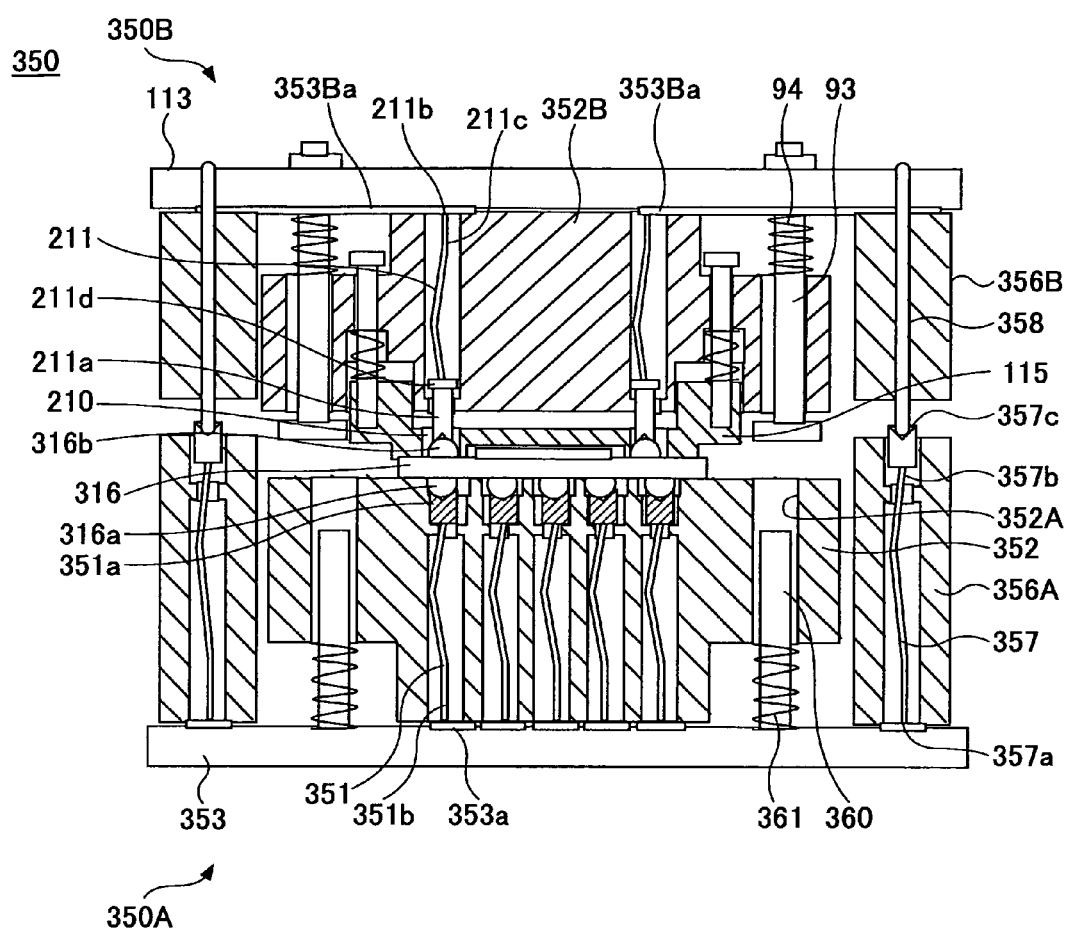
FIG. 48 is a cross-sectional view showing a state after the upper-side contactor and the lower-side contact makes a contact.

Then, after the lower ends of the probe pins 358 are received in the conical recessed portion of the contact portion 357c of the contact pieces 357 of the lower-side contactor 350A, the electrode wirings 353Ba in the substrate 113 of the upper-side contactor 350B and the electrode wirings 353a in the substrate 353 of the lower-side contactor 353A are electrically connected with each other (FIG. 48).

The electrode wirings are electrically connected to the electrode terminals 316a and 316b of the IC 316 through the contact pieces 211 and 351. That is, the contact pieces 211 can connect electrically with the contact pieces 351 through the electrode wirings 353Ba, the probe pins 358, the contact pieces 357 and also the electrode wiring 353a.

Therefore, with respect to the IC having electrode terminals on both front and back (upper and lower) surfaces, electric signals for testing and drive power can be simultaneously supplied to the electrode terminals of both sides.

That is, external connection terminals (not shown in the figures) for the electric signals for testing and drive power can be provided on one of the substrate 113 and the substrate 353. Thus, if an IC having electrode terminals on both front and back surfaces such as a POP (Package On Package), if there is a variation in the positions of the electrode terminals between the front and back surfaces, the contact pieces of each contactor can be in a state where it can be accurately aligned at the positions of the corresponding electrode terminals according to the movement of the base part in a transverse direction, the base part having the electrode terminal guiding holes in the contactors corresponding to the front and back surfaces of the IC.

Furthermore, the contact pieces of the contactors can change (move) their positions so as to carry out automatic alignment (centering) with respect to the electrode terminals.

Therefore, according to the seventh embodiment, as compared to the contactor of the above-mentioned fourth embodiment, a stable contact of an appropriate state can be achieved more efficiently, and an accurate and reliable electric characteristic test can be performed.

It should be noted that in any case of the fifth through seventh embodiments of the present invention, the recessed portions provided in the first contact portions 11a and 351a and the third contact portions 211a may be formed in the shapes shown in FIG. 17A through FIG. 19B. Additionally, the shape of the electrode terminal guiding holes 110, 210 and 390 may be that shown in FIG. 41.

Moreover, although a member having an elbow shape or a coil spring is used as a member (spring member) supporting the contact portion of the contact piece in the embodiments of the present invention, the structure of elastically supporting the contact portion is not limited to such as structure.

Moreover, there is no need to make the contact portion of the contact piece and the member (spring member) elastically supporting the contact portion into one piece, and the spring member and the contact portion may be formed as separate pats so that spring member contacts with the contact portion and the spring member elastically supports the contact portion.

Moreover, although the direction of movement of the base part is explained as "transverse direction" in the above-mentioned embodiments for the sake of convenience of illustration, the base part may be movable, for example, in a direction perpendicular to a the plane of the drawings in response to the positions of the electrode terminals.

It should be noted that although the semiconductor integrated circuit device (IC) is used as an electronic part in the above-mentioned embodiments, the present invention is not limited to the IC, and is applicable to other electronic parts.

The present invention is not limited to the specifically disclosed embodiments, and variations and modifications may be made without departing from the scope of the present invention.

The present application is based on Japanese priority applications No. 2005-046145 filed Feb. 22, 2005, and No. 2005-295639 filed Oct. 7, 2005, the entire contents of which are hereby incorporated herein by reference.

What is claimed is:

1. A contactor for electronic parts configured to make an electric connection to a plurality of electrode terminals of an electronic part, comprising:
   a plurality of contact members each having a first contact portion on one end thereof and a second contact portion on the other end thereof, the first contact portion having a recessed portion that receives one of the electrode terminals of said electronic part; and
   a base that accommodates and supports the plurality of the contact members,
   wherein each of said contact members is entirely movable in all horizontal directions.

2. The contactor for electronic parts as claimed in claim 1, wherein said first contact portion of said contact member has a generally cylindrical shape, a contact pin extending from one end of said first contact portion, an end of the contact pin serving as said second contact portion.

3. The contactor for electronic parts as claimed in claim 1, further comprising:
   a substrate having a terminal to which said second contact portion contacts; and
   a shaft extending perpendicularly on the substrate,
   wherein said base is movable along the shaft.

4. The contactor for electronic parts as claimed in claim 3, wherein said second contact portion of said contact member protrudes from a through hole of said base in a state where said base is separated from said substrate.

5. The contactor for electronic parts as claimed in claim 3, wherein said base includes:
   a contact portion hole that accommodates said first contact portion;
   a contact pin hole that accommodates said contact pin;
   an isolation wall between the contact portion hole and the contact pin hole; and
   a through hole provided in the isolation wall,
   wherein an inner diameter of said through hole is smaller than an outer diameter of said first contact portion.

6. The contactor for electronic parts as claimed in claim 5, wherein said contact pin has a structure having elasticity.

7. The contactor for electronic parts as claimed in claim 1, wherein said recessed portion of said first contact portion has a surface slanting toward a center of said first contact portion.

8. The contactor for electronic parts as claimed in claim 1, wherein said recessed portion of said first contact portion has a conical shape configured to accommodate a part of the one of the electrode terminals of said electronic part.

9. A contact method of making electrical connection to a plurality of electrode terminals of an electronic part, comprising:
   pressing said electrode terminals against recessed portions in contact portions of contact members so as to move said contact portions by a component force of a pressing force generated by the pressing, the component force directed in a direction substantially perpendicular to a direction of the pressing force; and
   causing the electrode terminals to be received in the recessed portions with a center of each of the electrode terminals in a transverse direction being aligned with a center of a corresponding one of the recessed portions of said contact portions.

10. The contact method as claimed in claim 9, wherein a movement of said contact portions in a horizontal direction is achieved by said electrode terminals of said electronic part being pressed against the recessed portions including slanting surfaces formed in said contact portions.

* * * * *